United States Patent
Asai et al.

(10) Patent No.: US 12,198,899 B2
(45) Date of Patent: Jan. 14, 2025

(54) MAGNETIZED PLASMOID INJECTION DEVICE

(71) Applicant: Nihon University, Tokyo (JP)

(72) Inventors: Tomohiko Asai, Tokyo (JP); Daichi Kobayashi, Tokyo (JP); Taichi Seki, Tokyo (JP)

(73) Assignee: Nihon University, Tokyo (JP)

( * ) Notice: Subject to any disclaimer, the term of this patent is extended or adjusted under 35 U.S.C. 154(b) by 643 days.

(21) Appl. No.: 17/289,218

(22) PCT Filed: Oct. 30, 2019

(86) PCT No.: PCT/JP2019/042585
§ 371 (c)(1),
(2) Date: Apr. 27, 2021

(87) PCT Pub. No.: WO2020/090890
PCT Pub. Date: May 7, 2020

(65) Prior Publication Data
US 2022/0013332 A1    Jan. 13, 2022

(30) Foreign Application Priority Data
Nov. 2, 2018   (JP) .................................. 2018-207684

(51) Int. Cl.
*H01J 37/32*     (2006.01)
*C23C 14/35*     (2006.01)
(Continued)

(52) U.S. Cl.
CPC ........ *H01J 37/32348* (2013.01); *C23C 14/35* (2013.01); *H01J 37/32357* (2013.01); *H05H 1/16* (2013.01); *H05H 1/3425* (2021.05)

(58) Field of Classification Search
CPC ............ C23C 14/0026; C23C 14/0031; C23C 14/021; C23C 14/022; C23C 14/221;
(Continued)

(56) References Cited

U.S. PATENT DOCUMENTS 2,806,124 A  *  9/1957  Gage ...................... B23K 10/00
                                                        219/121.36
3,270,236 A  *  8/1966  Michel ..................... H05H 1/54
                                                        313/157
(Continued)

FOREIGN PATENT DOCUMENTS

JP          2006-310101 A      11/2006
JP          2014-51699 A       3/2014
(Continued)

OTHER PUBLICATIONS

Ishikawa et al., "Dependence of Film Hardness on Applied Electric Field in a Carbon Thin-Film Deposition by Coaxial Ion Acceleration Method." Preprints of Academic Lecture Conference of College of Science and Technology Nihon University 2016, College of Science and Technology Nihon University, O-36, pp. 1186-1187, 2016.
(Continued)

*Primary Examiner* — Benjamin Kendall
*Assistant Examiner* — Joshua Reyes
(74) *Attorney, Agent, or Firm* — Blank Rome LLP

(57) ABSTRACT

A magnetized plasmoid injection device including a cylindrical external electrode, a cylindrical internal electrode coaxially disposed inside the external electrode, a plasma generating gas supply unit that supplies plasma generating gas in a pulse shape between the external electrode and the internal electrode, a magnetic field generation unit that applies a magnetic field that generates magnetized plasmoid between the external electrode and the internal electrode, a power supply control unit that applies a discharge voltage
(Continued)

between the external electrode and the internal electrode, and an impurity generation unit that contains an impurity in the magnetized plasmoid, the impurity generation unit having a cover electrode that opens to the external electrode, a thin-rod electrode that is located inside the cover electrode and is formed of an impurity, and an impurity generation power supply that applies a voltage to the cover electrode and the thin-rod electrode.

16 Claims, 7 Drawing Sheets

(51) Int. Cl.
    H05H 1/16      (2006.01)
    H05H 1/34      (2006.01)
(58) Field of Classification Search
    CPC ... C23C 14/325; C23C 14/3442; C23C 14/35;
        C23C 14/351; C23C 14/358; C23C 14/48;
        C23C 14/5826; C23C 14/5833; C23C
        16/0227; C23C 16/0245; C23C 16/45563;
        C23C 16/4587; C23C 16/507; C23C
        16/509; H01J 37/32091; H01J 37/3244;
        H01J 37/32348; H01J 37/32357; H01J
        37/32532; H01J 37/32541; H01J 37/3266;
        H01J 2237/334; H01J 2237/332; H01L
        21/67063; H01L 21/67207; H01L
        21/67213; H01L 21/67313; H01L
        21/67326; Y02E 30/10; G21B 1/05;
        G21B 1/11; H05H 1/16; H05H 1/26
    See application file for complete search history.

(56) References Cited

U.S. PATENT DOCUMENTS

| 3,770,935 | A | * | 11/1973 | Tateno | H05H 1/26 |
| | | | | | 219/121.52 |
| 3,989,512 | A | * | 11/1976 | Sayce | B01J 15/00 |
| | | | | | 219/121.36 |
| 4,048,436 | A | * | 9/1977 | Hiratake | B23K 10/00 |
| | | | | | 373/22 |
| 4,290,875 | A | * | 9/1981 | Duckworth | C23C 14/34 |
| | | | | | 204/192.12 |
| 4,801,435 | A | * | 1/1989 | Tylko | C03B 5/005 |
| | | | | | 422/906 |
| 6,916,398 | B2 | * | 7/2005 | Chen | C23C 16/4412 |
| | | | | | 257/E21.171 |
| 11,404,174 | B2 | * | 8/2022 | Laberge | H05H 1/02 |
| 2006/0163466 | A1 | * | 7/2006 | Park | H01J 37/026 |
| | | | | | 250/251 |
| 2007/0169516 | A1 | * | 7/2007 | Guskov | H05H 1/42 |
| | | | | | 65/531 |
| 2016/0074887 | A1 | * | 3/2016 | Kitamura | B05B 7/224 |
| | | | | | 239/79 |
| 2016/0374188 | A1 | * | 12/2016 | Asai | H05H 1/12 |

FOREIGN PATENT DOCUMENTS

| JP | 2017-57454 A | | 3/2017 | |
| JP | 2017057454 | * | 6/2017 | |
| JP | 6278414 B2 | | 2/2018 | |
| WO | WO 2015/002131 A1 | | 1/2015 | |
| WO | WO-2019165535 A1 | * | 9/2019 | ............... G21B 1/05 |

OTHER PUBLICATIONS

Takatsu et al., "Development of a Novel Film Generation Technique by Utilizing a Magnetized Coaxial Plasma Gun." Proceedings of Academic Lecture Conference of College of Science and Technology Nihon University 2013, College of Science and Technology Nihon University, O-11, pp. 1187-1188, 2013.

International Search Report, Application No. PCT/JP2019/042585, dated Jan. 21, 2020.

* cited by examiner

MAGNETIZED PLASMOID INJECTION DEVICE

Priority is claimed on Japanese Patent Application No. 2018-207684, filed Nov. 2, 2018, the content of which is incorporated herein by reference.

BACKGROUND OF THE INVENTION

Technical Field

The present invention relates to a magnetized plasmoid injection device, and more particularly to a technique suitable for use when magnetized plasmoid containing an impurity is injected at a high speed.

Background Art

A magnetized coaxial plasma generation device is known as a device that generates spheromak-like plasma. The magnetized coaxial plasma generation device generates plasma by applying a voltage between an external electrode and an internal electrode disposed coaxially to cause a discharge between the two electrodes. In this case, when a bias magnetic field is applied to this plasma, ejection is made in a state of including the bias magnetic field together with a magnetic field due to a discharge current, which becomes the spheromak plasma. In the spheromak plasma, both poloidal and toroidal confined magnetic fields are generated by a current flowing through itself, and configurations of the magnetic fields are self-organized to preserve magnetic helicity of magnetic field structure.

Such a device can easily inject magnetized plasmoid at a speed of several tens to several hundreds of kilometers per second, and thus is used for supplying a fuel particle to magnetic field confinement plasma and the like as a magnetized plasmoid high-speed injection device. As an example of such a device, the present inventors have filed an application as shown in Patent Document 1.

The magnetized plasmoid high-speed injection device has an effect that an electrode is sputtered by a current at the time of plasma generation. The magnetized plasmoid high-speed injection device can also mix and inject an impurity such as a metal element into the plasmoid by emphasizing this sputtering effect to form a film. As an example of such a device, the present inventors have filed applications as shown in Patent Document 2 and Patent Document 3 regarding an alloy thin film generating device capable of inexpensively producing an alloy thin film including a high melting-point metal.

CITATION LIST

Patent Document 1: Japanese Patent No. 6278414
Patent Document 2: Japanese Unexamined Patent Application, First Publication No. 2014-51699
Patent Document 3: Japanese Unexamined Patent Application, First Publication No. 2017-057454

SUMMARY OF THE INVENTION

Technical Problem

However, in the devices described in Patent Document 1 and Patent Document 2, the internal electrode for generating the plasma is used as an impurity source when the impurity is contained in the magnetized plasmoid. Therefore, in the devices described in Patent Document 1 and Patent Document 2, the internal electrode needs to be replaced according to a change of an element to be mixed or electrode wear. For this reason, there is a request to improve the above.

In particular, a large magnetized plasmoid high-speed injection device attached to a precisely managed ultra-high vacuum vessel is used in a case where the magnetized plasmoid is injected into the magnetic field confinement plasma. For this reason, there is a problem that the replacement of the electrode is not realistic in terms of cost and work.

Further, in the devices of the patent documents, an impurity serving as a tracer may be injected into the magnetic field confinement plasma by using the internal electrode for generating the plasma as the impurity source. Further, in the devices of the patent documents, film forming that requires more precise control of an impurity amount may be performed by using the internal electrode for generating the plasma as the impurity source. In such cases, there is a demand for more precise control of the impurity amount to be mixed in the plasma, as compared with a level that can be realized by the devices described in the above patent documents.

The present invention has been made in view of the above circumstances, and an object of the present invention is to achieve the following objects.

1. To improve the accuracy of an impurity concentration contained in magnetized plasmoid.
2. To provide a method of injecting a tracer contained compact toroid (TCCT).

Solution to Problem

The present invention is to solve the above-described problem and is a magnetized plasmoid injection device including
  a cylindrical external electrode,
  a cylindrical internal electrode coaxially disposed inside the external electrode,
  a plasma generating gas supply unit configured to supply plasma generating gas in a pulse shape between the external electrode and the internal electrode,
  a magnetic field generation unit configured to apply a magnetic field that generates magnetized plasmoid between the external electrode and the internal electrode,
  a plasma power supply configured to apply a discharge voltage between the external electrode and the internal electrode, and
  an impurity generation unit configured to cause the magnetized plasmoid to contain an impurity.

The impurity generation unit has a cover electrode that opens to the external electrode, a thin-rod electrode that is located inside the cover electrode and is formed of an impurity, and an impurity generation power supply that applies a voltage to the cover electrode and the thin-rod electrode.

In the magnetized plasmoid injection device of the present invention, a plurality of the impurity generation units may be provided.

In the present invention, it is preferable that the thin-rod electrode of the impurity generation unit is disposed outside an annular shape formed by the external electrode and the internal electrode in a tangential direction thereof.

In the magnetized plasmoid injection device of the present invention, the voltage may be applied to the impurity generation unit and then a voltage may be applied between the external electrode and the internal electrode.

In the present invention, means may be adopted in which the cover electrode of the impurity generation unit has a cylindrical shape having an inner diameter dimension smaller than a radial distance of an annular shape formed by the external electrode and the internal electrode.

In the magnetized plasmoid injection device of the present invention, the plasma generating gas supply unit may have a nozzle that opens to the external electrode, and the nozzle may be disposed along a tangential direction of an annular shape formed by the external electrode and the internal electrode.

In the magnetized plasmoid injection device of the present invention, the nozzle of the plasma generating gas supply unit and the thin-rod electrode of the impurity generation unit may be disposed along the same plane intersecting axes of the external electrode and the internal electrode.

The present invention is a magnetized plasmoid injection device including
- a cylindrical external electrode,
- a cylindrical internal electrode coaxially disposed inside the external electrode,
- a plasma generating gas supply unit configured to supply plasma generating gas in a pulse shape between the external electrode and the internal electrode,
- a magnetic field generation unit configured to apply a magnetic field that generates magnetized plasmoid between the external electrode and the internal electrode, and
- a plasma power supply configured to apply a discharge voltage between the external electrode and the internal electrode.

The plasma generating gas supply unit may have a nozzle that opens to the external electrode, and the nozzle may be disposed along a tangential direction of an annular shape formed by the external electrode and the internal electrode.

A magnetic confinement plasma device of the present invention may include the magnetized plasmoid injection device according to any one of the above, and the magnetized plasmoid may be injected from the magnetized plasmoid injection device.

A plasma treatment device of the present invention may include the magnetized plasmoid injection device according to any one of the above and a substrate-to-be-treated holding portion, and the magnetized plasmoid may be injected from the magnetized plasmoid injection device onto a substrate-to-be-treated held by the substrate-to-be-treated holding portion.

In the plasma treatment device of the present invention, the plasma treatment device may perform plasma film forming and plasma etching.

The present invention is a magnetized plasmoid injection device including
- a cylindrical external electrode,
- a cylindrical internal electrode coaxially disposed inside the external electrode,
- a plasma generating gas supply unit configured to supply plasma generating gas in a pulse shape between the external electrode and the internal electrode,
- a magnetic field generation unit configured to apply a magnetic field that generates magnetized plasmoid between the external electrode and the internal electrode,
- a plasma power supply configured to apply a discharge voltage between the external electrode and the internal electrode, and
- an impurity generation unit configured to cause the magnetized plasmoid to contain an impurity.

The impurity generation unit has a cover electrode that opens to the external electrode, a thin-rod electrode that is located inside the cover electrode and is formed of an impurity, and an impurity generation power supply that applies a voltage to the cover electrode and the thin-rod electrode.

Accordingly, in the magnetized plasmoid injection device of the present invention, the impurity generation power supply applies the voltage to the cover electrode and the thin-rod electrode. In this device, an impurity constituting the thin-rod electrode is ionized or particle-like and is scattered from the thin-rod electrode. In the device, the impurity is diffused into a magnetized plasmoid generation space formed between the external electrode and the internal electrode. Thereafter, in this device, the plasma generating gas is supplied from the plasma generating gas supply unit to the magnetized plasmoid generation space. In this device, the magnetic field generation unit applies the magnetic field between the external electrode and the internal electrode. In this device, the plasma power supply applies the discharge voltage between the external electrode and the internal electrode. Accordingly, in this device, the magnetized plasmoid containing the impurity is generated and injected.

Accordingly, in the magnetized plasmoid injection device of the present invention, different from the related art, it is possible to obtain a different type of the impurity contained in the generated and ejected magnetized plasmoid by setting the type of the impurity constituting the thin-rod electrode without depending on a type of impurity constituting the internal electrode. Further, in this device, it is possible to precisely control the amount of the impurity contained in the generated and ejected magnetized plasmoid.

In the magnetized plasmoid injection device of the present invention, it is possible to precisely control the amount of the impurity contained in the generated and ejected magnetized plasmoid, by setting a diameter dimension of the thin-rod electrode, disposition with respect to the magnetized plasmoid generation space formed between the external electrode and the internal electrode, the voltage applied by the impurity generation power supply, an impurity diffusion state in the magnetized plasmoid generation space, and a time (timing) between the impurity diffusion and the magnetized plasmoid generation.

In the magnetized plasmoid injection device of the present invention, the plurality of impurity generation units may be provided. Accordingly, impurities forming the thin-rod electrodes in the plurality of impurity generation units are set to different types (elements). Therefore, in this device, it is possible to generate and inject the magnetized plasmoid containing the plurality of types of impurity. Moreover, in this device, it is possible to precisely control the amount of the impurity contained in each impurity generation unit. Thus, for example, even for an impurity having a composition that a target cannot be produced by sputtering or the like, particularly impurities having a plurality of compositions, it is possible to generate and inject the magnetized plasmoid containing these impurities having the plurality of compositions as an accurate contained amount, in this device.

In the magnetized plasmoid injection device of the present invention, it is preferable that the thin-rod electrode of the impurity generation unit is disposed outside the annular shape formed by the external electrode and the internal electrode in the tangential direction thereof.

Accordingly, in this device, it is possible to easily replace only the thin-rod electrode and to easily mount only the thin-rod electrode, without opening the magnetized plasmoid generation space formed between the external electrode and the internal electrode directly to an external space. Therefore, in this device, it is possible to shorten a work time when the impurity contained in the generated and injected magnetized plasmoid is replaced. Accordingly, it is possible to improve the handleability of the magnetized plasmoid injection device and to shorten a maintenance time of the magnetized plasmoid injection device.

Further, in the magnetized plasmoid injection device of the present invention, it is possible to cause the impurity to be efficiently contained in the generated magnetized plasmoid in the magnetized plasmoid generation space formed between the external electrode and the internal electrode. Therefore, in this device, it is possible to cause an impurity that cannot be contained in the magnetized plasmoid in the device in the related art to be easily contained.

In the magnetized plasmoid injection device of the present invention, it is possible to apply the voltage between the external electrode and the internal electrode at the same time as or after the voltage is applied to the impurity generation unit. That is, in the magnetized plasmoid injection device of the present invention, it is possible to apply the voltage from the plasma power supply before and after the voltage is applied by the impurity generation power supply of the impurity generation unit.

Accordingly, in the magnetized plasmoid injection device of the present invention, it is possible to cause the impurity that cannot be contained in the magnetized plasmoid in the device in the related art to be easily contained. At the same time, in the magnetized plasmoid injection device of the present invention, it is possible to accurately control the concentration of the impurity contained in the magnetized plasmoid. In the magnetized plasmoid injection device of the present invention, it is possible to supply the plasma generating gas from the plasma generating gas supply unit, then apply the voltage by the impurity generation power supply of the impurity generation unit, and then apply the voltage from the plasma power supply.

In the magnetized plasmoid injection device of the present invention, means may be adopted in which the cover electrode of the impurity generation unit has a cylindrical shape having an inner diameter dimension smaller than a radial distance of an annular shape formed by the external electrode and the internal electrode.

Accordingly, in the magnetized plasmoid injection device of the present invention, it is possible to easily replace and mount only the thin-rod electrode without opening the magnetized plasmoid generation space formed between the external electrode and the internal electrode directly to the external space. Further, in the present invention, it is possible to easily mount the impurity generation unit on an existing magnetized plasmoid injection device.

In the magnetized plasmoid injection device of the present invention, the plasma generating gas supply unit may have the nozzle that opens to the external electrode, and the nozzle may be disposed along the tangential direction of the annular shape formed by the external electrode and the internal electrode. Accordingly, it is possible to efficiently supply the plasma generating gas to the magnetized plasmoid formed in a donut shape.

In the magnetized plasmoid injection device of the present invention, the nozzle of the plasma generating gas supply unit and the thin-rod electrode of the impurity generation unit may be disposed along the same plane intersecting the axes of the external electrode and the internal electrode. Accordingly, in this device, it is possible to cause the impurity to be efficiently contained in the magnetized plasmoid formed in a donut shape by supplying the plasma generating gas.

The present invention is a magnetized plasmoid injection device including
    a cylindrical external electrode,
    a cylindrical internal electrode coaxially disposed inside the external electrode,
    a plasma generating gas supply unit configured to supply plasma generating gas in a pulse shape between the external electrode and the internal electrode,
    a magnetic field generation unit configured to apply a magnetic field that generates magnetized plasmoid between the external electrode and the internal electrode, and
    a plasma power supply configured to apply a discharge voltage between the external electrode and the internal electrode.

The plasma generating gas supply unit may have a nozzle that opens to the external electrode, and the nozzle may be disposed along a tangential direction of an annular shape formed by the external electrode and the internal electrode. Accordingly, in the magnetized plasmoid injection device of the present invention, it is possible to efficiently supply the plasma generating gas to the magnetized plasmoid formed in a donut shape.

The magnetic confinement plasma device of the present invention may include the magnetized plasmoid injection device according to any one of the above, and the magnetized plasmoid may be injected from the magnetized plasmoid injection device. Accordingly, in the magnetic confinement plasma device of the present invention, it is possible to generate and inject the magnetized plasmoid containing an impurity independent of the internal electrode and to supply the magnetized plasmoid containing a tracer element useful in the magnetic confinement plasma device.

The plasma treatment device of the present invention may include the magnetized plasmoid injection device according to any one of the above and a substrate-to-be-treated holding portion, and the magnetized plasmoid may be injected from the magnetized plasmoid injection device onto a substrate-to-be-treated held by the substrate-to-be-treated holding portion. Accordingly, a thin film or the like is formed by the plasma treatment device of the present invention, and thus it is possible to perform plasma treatment such as film forming on the substrate-to-be-treated while easily forming an alloy thin film that cannot be formed in the related art. A thin film or the like is formed by the plasma treatment device of the present invention, and thus it is possible to perform plasma treatment such as film forming on the substrate-to-be-treated while easily controlling an impurity composition ratio, which has been difficult to realize.

In the plasma treatment device of the present invention, the plasma treatment device may perform plasma film forming and plasma etching.

Advantageous Effects of Invention

According to the present invention, it is possible to achieve the effect of being able to cause the impurity element type, which has been difficult to be contained, to be contained in the magnetized plasmoid and to easily generate

DESCRIPTION OF EMBODIMENTS

Figure 1:
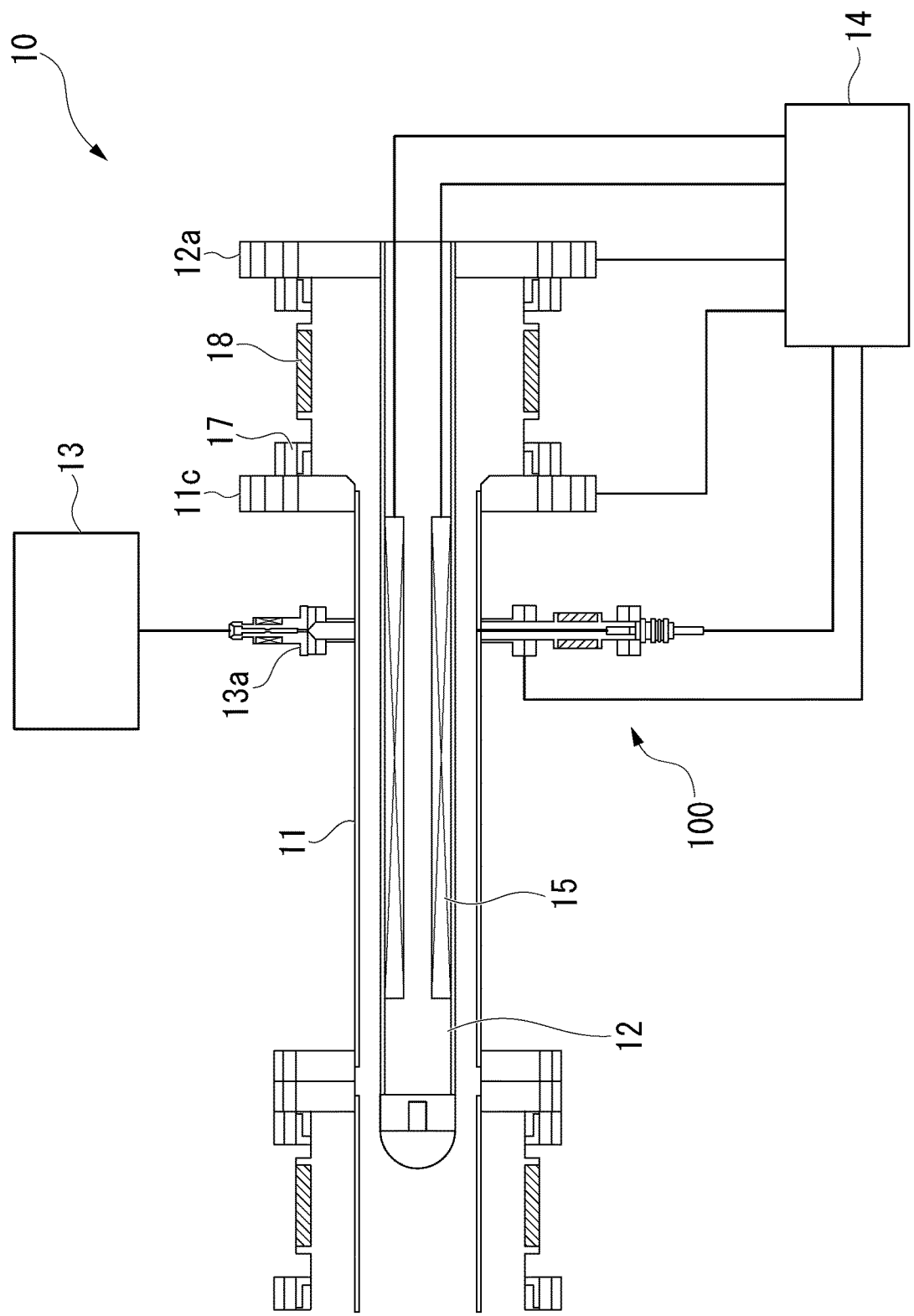
FIG. 1 is a longitudinal cross-sectional view of a first embodiment of a magnetized plasmoid injection device of the present invention.
Figure 2:
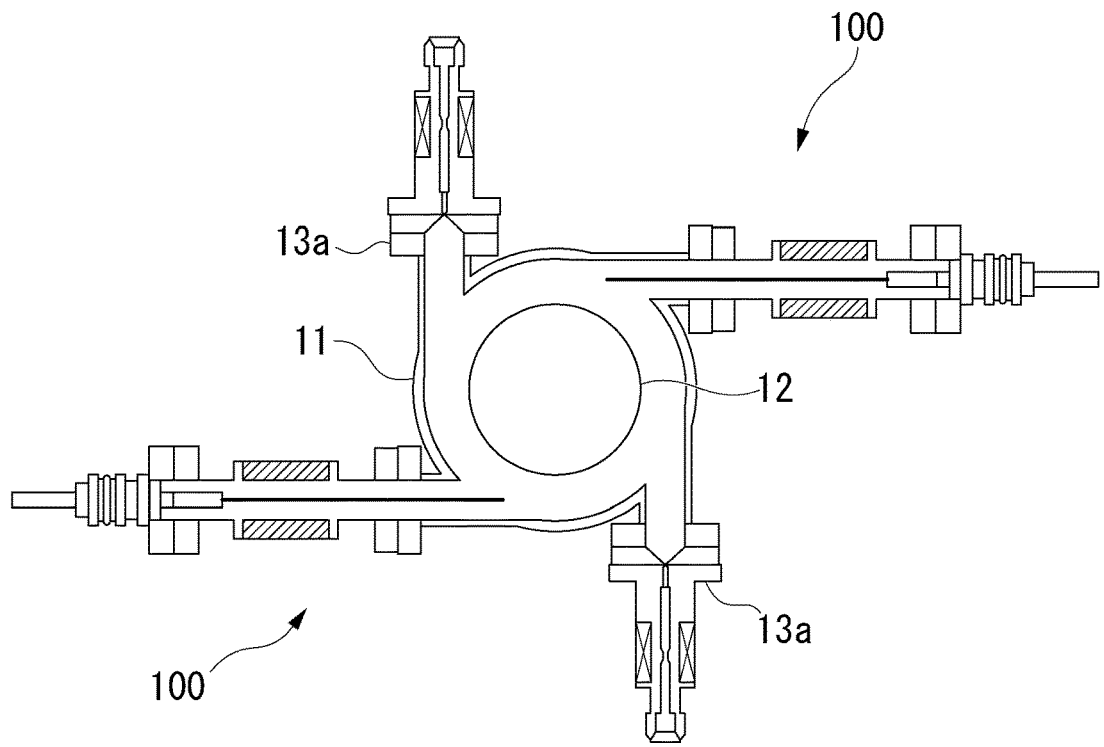
FIG. 2 is a transverse cross-sectional view of the first embodiment of the magnetized plasmoid injection device of the present invention.

Hereinafter, a first embodiment of a magnetized plasmoid injection device of the present invention will be described with reference to drawings. FIG. 1 is a longitudinal cross-sectional view of the magnetized plasmoid injection device of the present embodiment. FIG. 2 is a transverse cross-sectional view of the magnetized plasmoid injection device of the present embodiment. In the figures, a reference numeral 10 is the magnetized plasmoid injection device.

As shown in FIG. 1, the magnetized plasmoid injection device 10 of the present embodiment includes an external electrode 11, an internal electrode 12, a plasma generating gas supply unit 13, a power supply control unit 14, and a bias coil (magnetic field generation unit) 15, an impurity generation unit 100, and a magnetic flux holding portion (not shown).

The external electrode 11 is made of, for example, a cylindrical conductor. The internal electrode 12 is disposed coaxially with the external electrode 11. An annular magnetized plasmoid generation space is formed between the external electrode 11 and the internal electrode 12.

A space radially inside of the cylindrical external electrode 11 and radially outside of the cylindrical internal electrode 12 is defined as the annular magnetized plasmoid generation space. A cylindrical surface of the external electrode 11 and a cylindrical surface of the internal electrode 12 form the annular magnetized plasmoid generation space to have the same separation distance in the radial direction from each other on the whole circumference in a circumferential direction.

In the magnetized plasmoid injection device 10, one end of the external electrode 11 is connected to a flange 11a. One end of the internal electrode 12 extends to the outside of the one end of the external electrode 11. The one end of the internal electrode 12 is connected to a flange 12a at the one end of the internal electrode 12. The flange 11a and the flange 12a are disposed coaxially. Moreover, the flange 11a and the flange 12a are disposed separated from each other in an axial direction.

Positions of the external electrode 11 and the internal electrode 12 are fixed by the flange 11a and the flange 12a. The flange 11a has an inner diameter that matches the one end of the cylindrical external electrode 11. The flange 11a is an annular plate extending outside the external electrode 11. The flange 12a has an inner diameter that matches the one end of the cylindrical internal electrode 12. The flange 12a is an annular plate extending outside the internal electrode 12.

Facing surfaces of the flanges 11a and 12a are separated from each other in a parallel state. The flanges 11a and 12a are connected to each other by a cylindrical member 17. In the cylindrical member 17, an annular insulation member 18 is disposed at an intermediate position between the flange 11a and the flange 12a. In the insulation member 18, both ends of the cylindrical member 17 are in an insulated state. The flange 11a and the flange 12a are insulated by the insulation member 18.

A space between the flange 11a and the flange 12a is surrounded by the cylindrical member 17 and the insulation member 18 which are circumferential surfaces. The space between the flange 11a and the flange 12a can be sealed in a vacuum state through the cylindrical member 17 and the insulation member 18. A space radially inside of the cylindrical member 17 and the insulation member 18 and radially outside of the internal electrode 12 communicates with the annular magnetized plasmoid generation space formed between the external electrode 11 and the internal electrode 12.

The external electrode 11 has an open end such that plasma is emitted from the other end. The external electrode 11 and the internal electrode 12 are preferably made of a material that is not magnetized, has a high melting point, and is easy to process. For example, the electrodes may be made of stainless steel or the like. The other end of the internal electrode 12 is closed in a sealed state. A bias coil 15 is disposed inside the internal electrode 12.

A nozzle 13a of the plasma generating gas supply unit 13 is connected to an outer circumferential position of the external electrode 11. The plasma generating gas supply unit 13 is connected to the nozzle 13a so as to supply plasma generating gas to the annular magnetized plasmoid generation space formed between the external electrode 11 and the internal electrode 12.

The plasma generating gas supply unit 13 can supply the plasma generating gas, for example, hydrogen gas, helium gas, argon gas, or the like to the nozzle 13a.

As shown in FIG. 2, the nozzle 13a is disposed such that a tangential direction of the annular magnetized plasmoid generation space formed by the external electrode 11 and the internal electrode 12 is a gas ejection direction on a plane orthogonal to axes of the external electrode 11 and the internal electrode 12. That is, the nozzle 13a opens in the annular magnetized plasmoid generation space so as to penetrate the external electrode 11 from the outside and ejects the plasma generating gas such that the gas flows in the circumferential direction of the internal electrode 12 on an outer circumference of the internal electrode 12 in the annular magnetized plasmoid generation space.

The nozzle 13a opens toward the inside of the external electrode 11 so as to penetrate the external electrode 11 from the outside. The nozzle 13a ejects the plasma generating gas inside the external electrode 11. The external electrode 11 and the internal electrode 12 form the annular magnetized plasmoid generation space between the external electrode 11 and the internal electrode 12, on the axis orthogonal plane orthogonal to the axes of the external electrode 11 and the internal electrode 12. The magnetized plasmoid generation space has substantially the same cross-sectional shape in the axial direction of the external electrode 11 and the internal electrode 12. The nozzle 13a ejects the plasma generating gas in the tangential direction of the annular magnetized plasmoid generation space on the axis orthogonal plane. The nozzle 13a ejects the plasma generating gas to the outer circumference of the internal electrode 12 on the axis orthogonal plane. The nozzle 13a ejects the plasma generating gas in a tangential direction of the internal electrode 12 on the axis orthogonal plane. The nozzle 13a ejects the plasma generating gas along the axis orthogonal plane.

As shown in FIG. 2, the nozzle 13a is installed at two places so as to be located at both ends of the external electrode 11 in the radial direction with respect to the annular magnetized plasmoid generation space formed by the external electrode 11 and the internal electrode 12, on the plane orthogonal to the axes of the external electrode 11 and the internal electrode 12. The two nozzles 13a are set so as to be parallel to each other and to eject the plasma generating gas in opposite directions.

A separation distance between the two nozzles 13a on the axis orthogonal plane is set to be substantially equal to a diameter dimension of the annular magnetized plasmoid generation space. The separation distance between the two nozzles 13a on the axis orthogonal plane is set to be smaller than a diameter dimension of the external electrode 11. The separation distance between the two nozzles 13a on the axis orthogonal plane is set to be larger than a diameter dimension of the internal electrode 12. The separation distance between the two nozzles 13a on the axis orthogonal plane is defined as a distance along the axis orthogonal plane and in a direction orthogonal to axes of the two nozzles 13a. The two nozzles 13a can have the same opening dimension. The opening dimension of the nozzle 13a may be set to be substantially equal to or smaller than the distance in the radial direction between the cylindrical surface of the external electrode 11 and the cylindrical surface of the internal electrode 12.

Figure 3:
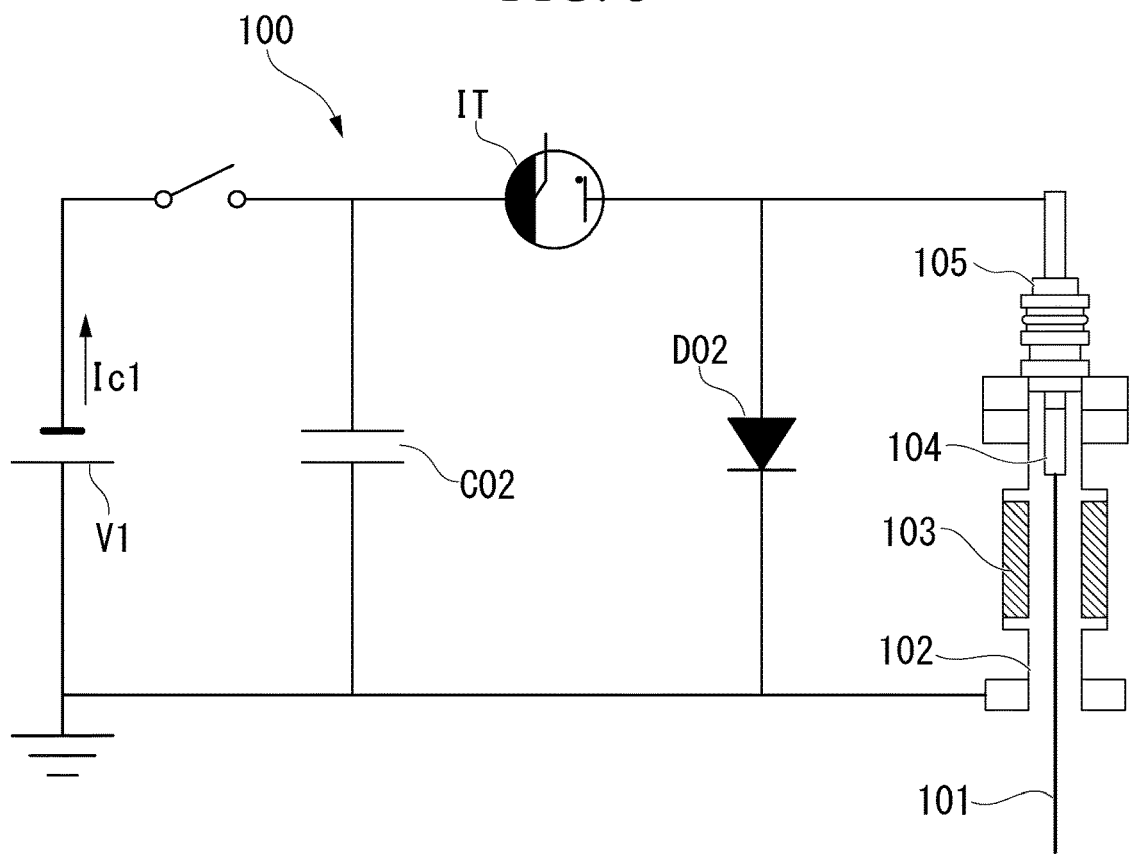
FIG. 3 is a cross-sectional view of an impurity generation unit in the first embodiment of the magnetized plasmoid injection device of the present invention.

The impurity generation unit 100 is connected to the outside of the external electrode 11. FIG. 3 is a cross-sectional view of an impurity generation unit in the magnetized plasmoid injection device of the present embodiment.

As shown in FIGS. 1 and 3, the impurity generation unit 100 has a thin-rod electrode 101 made of an impurity contained in the magnetized plasmoid. The thin-rod electrode 101 is located in a cylindrical cover electrode 102. The cover electrode 102 is connected such that one end thereof opens to the external electrode 11. The thin-rod electrode 101 may be made of a conductor material contained in the magnetized plasmoid as the impurity, for example, a heavy metal such as tungsten, molybdenum, or gold, or may be made of a simple substance such as carbon, chromium, niobium, or fluorine or a compound thereof contained in the magnetized plasmoid as a film forming material.

Further, Table 1 shows examples of an impurity type (impurity element) contained in the thin-rod electrode 101, a formed state (thin-rod electrode state) as the thin-rod electrode 101, and usage of the impurity.

TABLE 1

| Impurity element | Thin-rod electrode state | Usage |
|---|---|---|
| Carbon | Graphite | DLC (Diamondlike Carbon) formation |
| Aluminum | Simple substance | Additive during DLC formation Additive for making semiconductor, photoelectric element (Al + Si) |
| Titanium | Simple substance | Additive during DLC formation Additive for reducing friction coefficient Additive for improving adhesion, oxidation resistance |
| Vanadium | Simple substance | Vanadium alloy formation Low radiation material (reactor wall) |
| Chromium | Iron + Plating | Reactor wall material (SUS), Bearing, Punching die |
| Nickel | Simple substance | Reactor wall material (SUS) |
| Iron | Simple substance | Reactor wall material (SUS) |
| Copper | Simple substance | Additive during DLC formation Additive for imparting conductivity |
| Molybdenum | Simple substance | Divertor, First wall |
| Tin | Simple substance | Additive during DLC formation Additive for imparting conductivity |
| Tungsten | Simple substance | Divertor material, Automobile part, Cutting tool |
| Gold | Simple substance or Plating | Additive during DLC formation Additive for imparting conductivity |

A cover electrode base portion 104 is connected to the other end of the cover electrode 102. A base end of the thin-rod electrode 101 is connected and fixed to the cover electrode base portion 104. The cover electrode 102 has a cylindrical insulation member 103 between one end and the other end of the cover electrode 102. The insulation member 103 connects the one end of the cover electrode 102 that opens to the external electrode 11 and the cover electrode base portion 104 in an insulated state. The thin-rod electrode 101 is disposed at the center of the cover electrode 102, the insulation member 103, and the cover electrode base portion 104 so as to match their axes. The cover electrode 102, the insulation member 103, and the cover electrode base portion 104 are all sealed so as to be separated from the thin-rod electrode 101 and such that the inside thereof can be vacuum-decompressed.

In the cover electrode base portion 104, a separation portion 105 to which the base end of the thin-rod electrode 101 is connected and fixed can be separated from the cover electrode 102. The base end of the thin-rod electrode 101 may be connected to the separation portion 105 by using a crimp terminal. Specifically, the base end of the thin-rod electrode 101 can be connected to the separation portion 105 by employing a crimp terminal, crimping using a set screw, or the like.

The impurity generation unit 100 separates the separation portion 105 from the cover electrode base portion 104 side to be able to separate the separation portion 105 and the thin-rod electrode 101 from the cover electrode 102, the insulation member 103, and the cover electrode base portion 104. The cover electrode base portion 104 and the separation portion 105 can be sealed in a state where the portions are connected. An inner diameter dimension at which the cover electrode 102 opens to the external electrode 11 is set to be substantially equal to or smaller than the distance (interval) in the radial direction between the external electrode 11 and the internal electrode 12. That is, an opening dimension of the cover electrode 102 may be set to be substantially equal to or smaller than the distance in the radial direction between the cylindrical surface of the external electrode 11 and the cylindrical surface of the internal electrode 12.

As shown in FIG. 3, the impurity generation unit 100 is installed at two places so as to be located at both ends of the external electrode 11 in the radial direction with respect to the annular magnetized plasmoid generation space formed by the external electrode 11 and the internal electrode 12, on the plane orthogonal to the axes of the external electrode 11 and the internal electrode 12. The two impurity generation units 100 are set so as to be parallel to each other and such that tip ends of the thin-rod electrodes 101 are opposite to each other.

A plurality of impurity generation units 100 are disposed so as to be orthogonal to the nozzle 13a on the surface orthogonal (intersecting) with the axes of the external electrode 11 and the internal electrode 12. The disposition of the cover electrode 102 and the disposition of the nozzle 13a can be point-symmetrical in the axis orthogonal plane. That is, the cover electrode 102 and the nozzle 13a can be disposed symmetrically with respect to the axes of the external electrode 11 and the internal electrode 12.

The cover electrode 102 opens toward the inside of the external electrode 11 so as to penetrate the external electrode 11 from the outside. Axial directions of the cover electrode 102 and the thin-rod electrode 101 are disposed along the tangential direction of the annular magnetized plasmoid generation space on the axis orthogonal plane. The cover electrode 102 positions the thin-rod electrode 101 radially outward around the internal electrode 12 on the axis orthogonal plane. The cover electrode 102 positions the thin-rod electrode 101 in the tangential direction of the internal electrode 12 on the axis orthogonal plane.

The tip end of the thin-rod electrode 101 may be disposed outside of the magnetized plasmoid generation space, that is, at a position where the surface of the external electrode 11 having the cylindrical shape does not protrude toward the internal electrode 12 from a cylindrical surface extended by the opening part of the cover electrode 102.

Further, the tip end of the thin-rod electrode 101 may be disposed in a state of protruding inside the magnetized plasmoid generation space from the external electrode 11 or in a state of being located outside the magnetized plasmoid generation space from the external electrode 11, that is, on the cover electrode base portion 104 side.

An impurity generation power supply is connected to the impurity generation unit 100. The impurity generation power supply is connected to the cover electrode 102 and the cover electrode base portion 104 and sputters only the thin-rod electrode 101. Therefore, a crowbar circuit using a diode can be employed. A function of the impurity generation power supply is included in the power supply control unit 14.

Specifically, as shown in FIG. 3, a circuit having a power supply V1 is connected to a circuit having a capacitor C02 in parallel in the crowbar circuit. The circuits are parallelly connected to a circuit of a bypass diode D03 and the cover electrode 102 and the cover electrode base portion 104, which are loads, through an ignitron IT (switch element). The circuit of the capacitor C02 is the crowbar circuit, and the capacitor C02 is a crowbar capacitor. The capacitor C02 is a charging capacitor. The crowbar circuit shown in FIG. 3 is an example and is not limited to this configuration as long as a sputtering voltage capable of diffusing the impurity can be applied from the thin-rod electrode 101 for the pulse drive of the bias coil 15 described below.

The power supply control unit 14 includes a plasma power supply (power supply circuit), a pulse power supply for a bias coil, the impurity generation power supply, and a control unit that controls the power supplies.

The plasma power supply (power supply circuit) in the power supply control unit 14 applies a load signal between the external electrode 11 and the internal electrode 12. The plasma power supply (power supply circuit) may apply the load signal in a direct current manner or apply a continuous pulse signal, for example. The load signal means a load voltage applied between the external electrode 11 and the internal electrode 12, or a load current flowing at that time.

Figure 4:
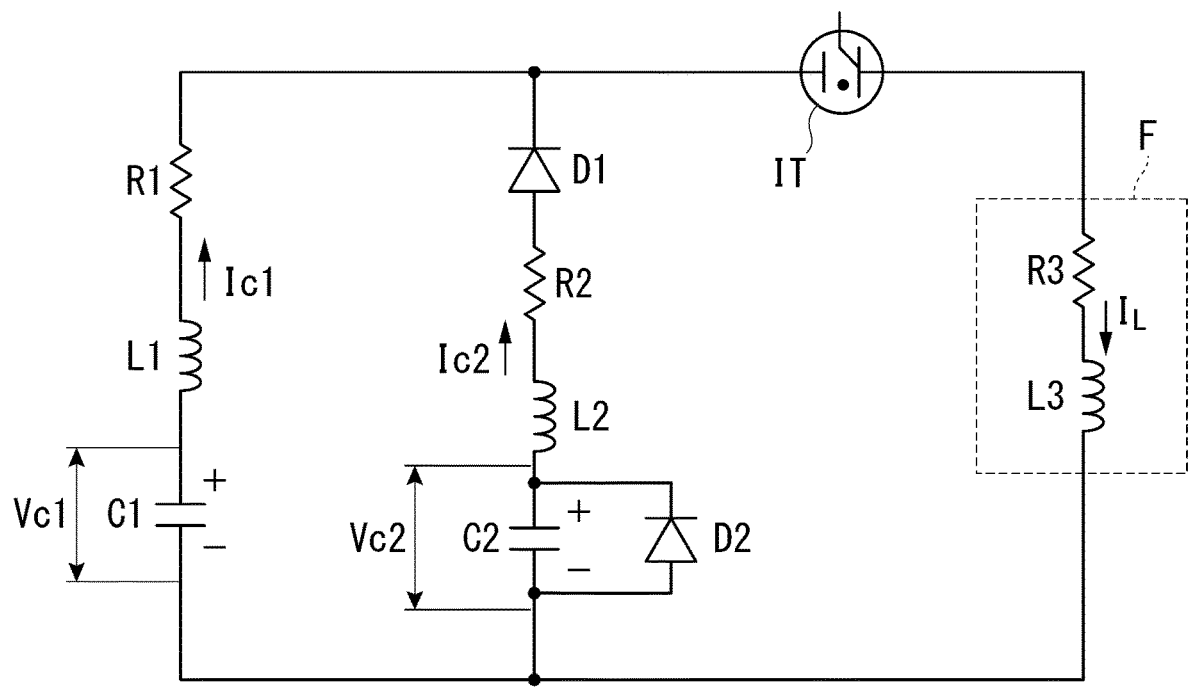
FIG. 4 is a circuit diagram showing an example of a plasma power supply (power supply circuit) in the first embodiment of the magnetized plasmoid injection device of the present invention.

FIG. 4 is a circuit diagram showing an example of the plasma power supply (power supply circuit) in the magnetized plasmoid injection device of the present embodiment. In the plasma power supply (power supply circuit), a circuit of a capacitor C1, an inductance L1, and a resistor R1 is parallelly connected to a circuit of a capacitor C2, an inductance L2, a resistor R2, and a diode D1 in which a bypass diode D2 is connected in parallel. The circuits are connected to a load F through an ignitron IT (switch element). The circuit of the diode D1, the capacitor C2, and the like is a power crowbar circuit. The diode D1 is a crowbar switch, and the capacitor C2 is a power crowbar capacitor. The capacitors C1 and C2 are charging capacitors.

The capacitors C1 and C2 are used such that capacitances of the capacitors are C1<C2, that is, the capacitor C2 has a larger capacitance than the capacitor C1. Voltages Vc1 and Vc2 of the capacitors C1 and C2 are charged such that the voltages have the same polarity and Vc1>Vc2, that is, the voltage Vc1 of the capacitor C1 is higher than the voltage Vc2 of the capacitor C2.

When the ignitron IT is conducted under the control of the control unit (not shown) in this state, the capacitor C1 starts discharging to cause a discharge current Ic1 to flow and a load current IL (=Ic1) to flow through the load F. In this case, since the diode D1 becomes non-conducting with respect to the voltage Vc1 of the capacitor C1, the capacitor C2 does not discharge. When the discharge of the capacitor C1 progresses and the voltage Vc1 of the capacitor C1 becomes lower than the voltage Vc2 of the capacitor C2, the diode D1 conducts and the capacitor C2 starts discharging to cause a discharge current Ic2 of the capacitor C2 to flow through the load F. Thereafter, the discharge currents Ic1 and Ic2 (IL=Ic1+Ic2) flow through the load F. The load current IL flows through the diode D2 and returns. Therefore, the load current IL is a non-oscillating unipolar damping current.

The load current is damped in a short time in the case of only the capacitor C1, but the load current IL is gradually damped by the addition of the discharge of the capacitor C2 having a large capacitance. A rise of the load current IL is determined by the capacitor C1 and thus becomes sharp. That is, the power crowbar circuit shown in FIG. 4 can supply a load current having a sharp rise and gradual damping and can continuously generate plasmoid with one charge.

The power crowbar circuit shown in FIG. 4 uses the capacitor C1 having a small capacitance and the power crowbar capacitor C2 having a large capacitance, and makes a charging voltage of the capacitor C1 higher than a charging voltage of the capacitor C2. Accordingly, the discharge current of the capacitor C1 contributes when the load current rises, and then the discharge current of the capacitor C2 mainly contributes. Therefore, the load current rises sharply and is damped slowly. The diode D1 is used as the crowbar switch. When a discharge voltage of the capacitor C1 becomes lower than the charging voltage of the capacitor C2, the diode D1 automatically conducts and starts the discharge of the capacitor C2.

Another semiconductor switch capable of switching between conduction and non-conduction under the control of the control unit can be used instead of the ignitron, as the ignitron IT. The ignitron IT may be connected in series with the resistor R1 to the resistor R1 side from a connection point of the diode D1. The loss becomes smaller as the resistors R1 and R2 become smaller, and the pulsation of the load current IL becomes smaller as the inductances L1 and L2 become smaller. When the inductance L1 is made larger than the inductance L2, the return of the load current IL to the capacitor C1 becomes small and most of the load current IL flows through the power crowbar circuit.

The pulse power supply for the bias coil in the power supply control unit 14 is for pulse-driving the bias coil 15. The pulse power supply for the bias coil is configured such that, for example, a sine wave current having a predetermined frequency can be applied to the bias coil 15. For example, a power supply (capacitor) may be inverter-controlled using a transistor to apply a continuous pulse signal of a rectangular wave to the bias coil 15.

The control unit in the power supply control unit 14 controls the pulse power supply for the bias coil so as to pulse-drive the bias coil 15, controls an additional signal that is output between the external electrode 11 and the internal electrode 12 from the plasma power supply (power supply circuit), and controls the impurity generation power supply.

The bias coil 15 is disposed inside the internal electrode 12. Accordingly, baking of the vacuum vessel, which is indispensable for obtaining an ultra-high vacuum, becomes possible without being affected by the bias coil. Thus, the adsorbed gas can be removed. The bias coil 15 applies a bias magnetic field to the plasma generated between the external electrode 11 and the internal electrode 12. Accordingly, the plasma is emitted in a state including the magnetic field due to the discharge current and the bias magnetic field, and thus spheromak plasma is generated.

The control unit in the power supply control unit 14 controls the pulse power supply for the bias coil such that the bias coil 15 is pulse-driven in a time that is sufficient for the bias magnetic field required for generating the spheromak plasma to be applied between the external electrode 11 and the internal electrode 12 and is shorter than a permeation time of magnetic flux of the bias magnetic field to the magnetic flux holding portion. That is, the spatial distribution of the magnetic flux of the bias magnetic field is controlled at time intervals such that the magnetic flux does not permeate into the magnetic flux holding portion, and the required bias magnetic field is efficiently generated between the external electrode 11 and the internal electrode 12.

The magnetic flux holding portion is used to prevent the magnetic flux of the bias magnetic field applied by the bias coil 15 from leaking to the outside. For example, the magnetic flux holding portion is formed integrally with the external electrode 11 in the example shown in FIG. 1. That is, the external electrode 11 is made of a material having high conductivity and low magnetic permeability such as copper, and a thickness of the external electrode 11 is designed to be sufficient for a time longer than the time required for the bias magnetic field and shorter than the time for the magnetic flux to permeate into the magnetic flux holding portion.

Alternatively, the magnetic flux holding portion may be configured to be detachable from the external electrode 11. Accordingly, it is possible to change a thickness of the magnetic flux holding portion according to a plasma generation condition and the like. In this case, the magnetic flux holding portion is formed according to an outer shape of the external electrode 11. For example, in a case where the external electrode 11 has a cylindrical shape, the magnetic flux holding portion also has the cylindrical shape accordingly. The magnetic flux holding portion is configured to mostly cover the external electrode 11 in a jacket shape or a shell shape.

At the same time, the detachable magnetic flux holding portion is disposed outside the external electrode 11. The magnetic flux holding portion is made of a material having high conductivity and low magnetic permeability. For example, copper, a copper alloy, or the like may be used. As for a length of the magnetic flux holding portion, it is possible to efficiently confine the magnetic flux of the bias magnetic field generated from the bias coil 15 as long as there is a length equal to or longer than a length of the bias coil 15.

As for the thickness of the magnetic flux holding portion, the magnetic flux holding portion has a thickness that prevents the magnetic flux from permeating into and passing through the magnetic flux holding portion, even in a case where the bias coil 15 is driven for a time sufficient to apply the bias magnetic field required for generating the spheromak plasma between the external electrode 11 and the internal electrode 12. When the magnetic flux is applied to the magnetic flux holding portion for a long time, the magnetic flux permeates into and passes through the magnetic flux holding portion. Therefore, a pulse-drive time is set to be longer than the time required for the bias magnetic field and is set in consideration of the permeation time of the magnetic flux and the thickness of the magnetic flux holding portion.

The control unit in the power supply control unit 14 controls the impurity generation power supply to apply a voltage to the thin-rod electrode 101 of the impurity generation unit 100 for diffusing the impurity in the magnetized plasmoid generation space, and controls the plasma power supply (power supply circuit) to apply the discharge voltage between the external electrode 11 and the internal electrode 12 in a state where the bias magnetic field required for generating the spheromak plasma is applied between the external electrode 11 and the internal electrode 12 under the control of the pulse power supply for the bias coil.

At this time, the control unit in the power supply control unit 14 applies the bias magnetic field at the same time as or before and after applying the voltage to the thin-rod electrode 101, and then applies the discharge voltage between the external electrode 11 and the internal electrode 12 to cause the impurity to be contained in the generated plasma. In this case, for example, it is preferable to perform the control of forming the bias magnetic field and causing the discharge for the plasma generation after several microseconds to several hundreds microseconds after applying the voltage to the thin-rod electrode 101. Alternatively, a timing of applying the voltage or the bias magnetic field to the thin-rod electrode 101 is set according to a time scale of each pulse discharge and the diffusion of the impurity element to cause the impurity to be contained in the generated plasma.

Next, the generation of magnetized plasmoid containing the impurity in the magnetized plasmoid injection device 10 of the present embodiment will be described.

Figure 5:
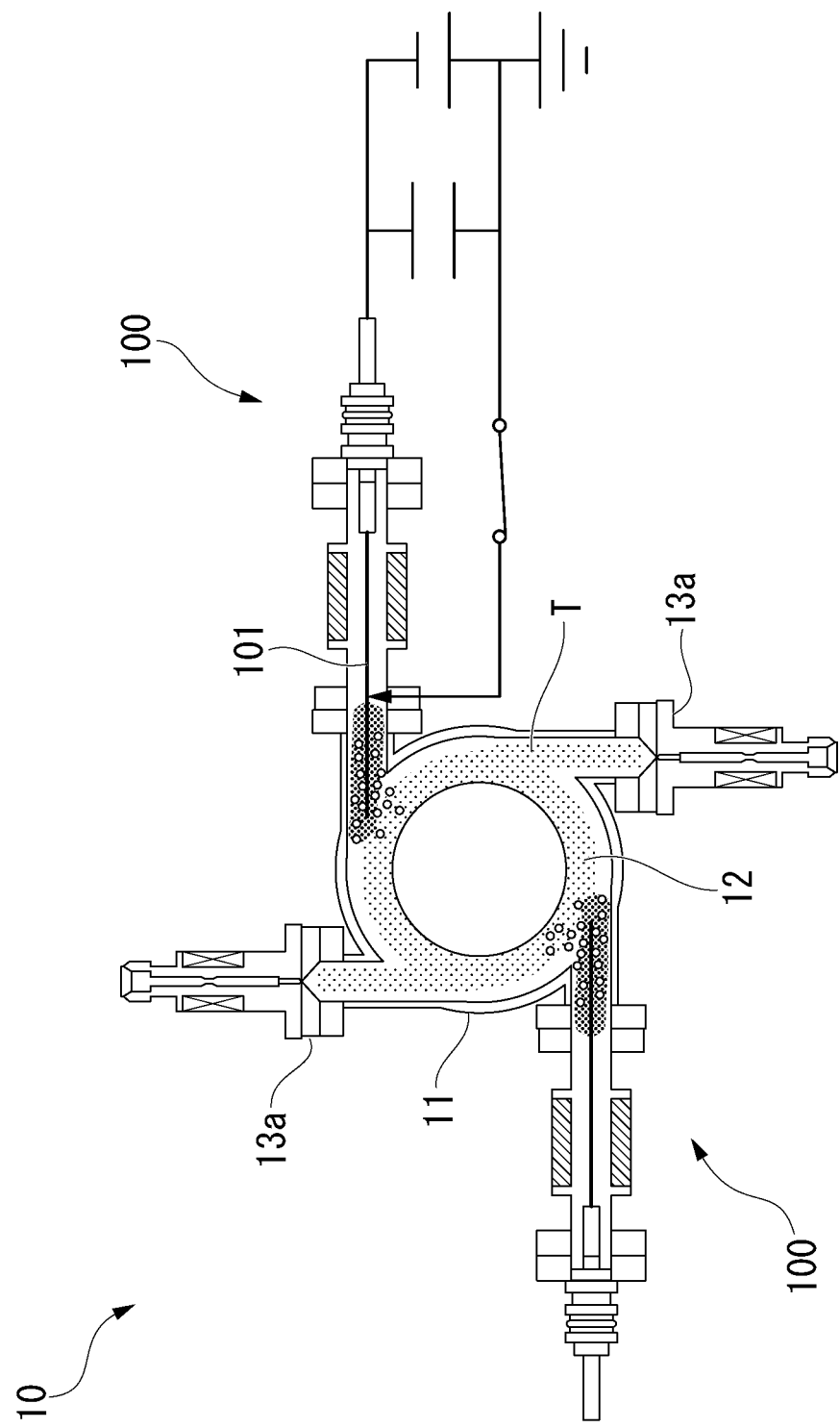
FIG. 5 is a transverse cross-sectional view of an impurity diffusion state in the first embodiment of the magnetized plasmoid injection device of the present invention.
Figure 6:
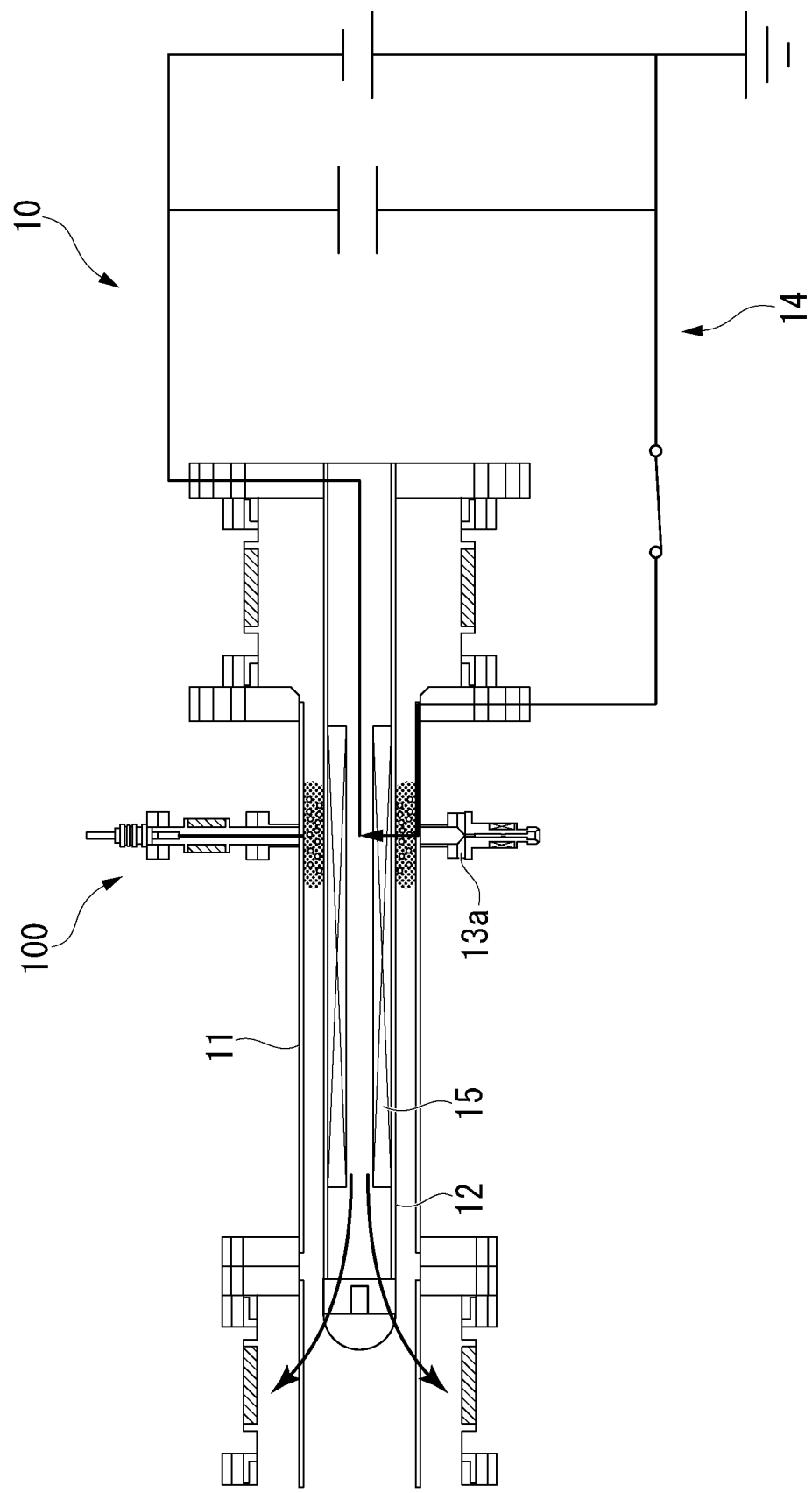
FIG. 6 is a longitudinal cross-sectional view of a magnetized plasmoid generation state in the first embodiment of the magnetized plasmoid injection device of the present invention.
Figure 7:
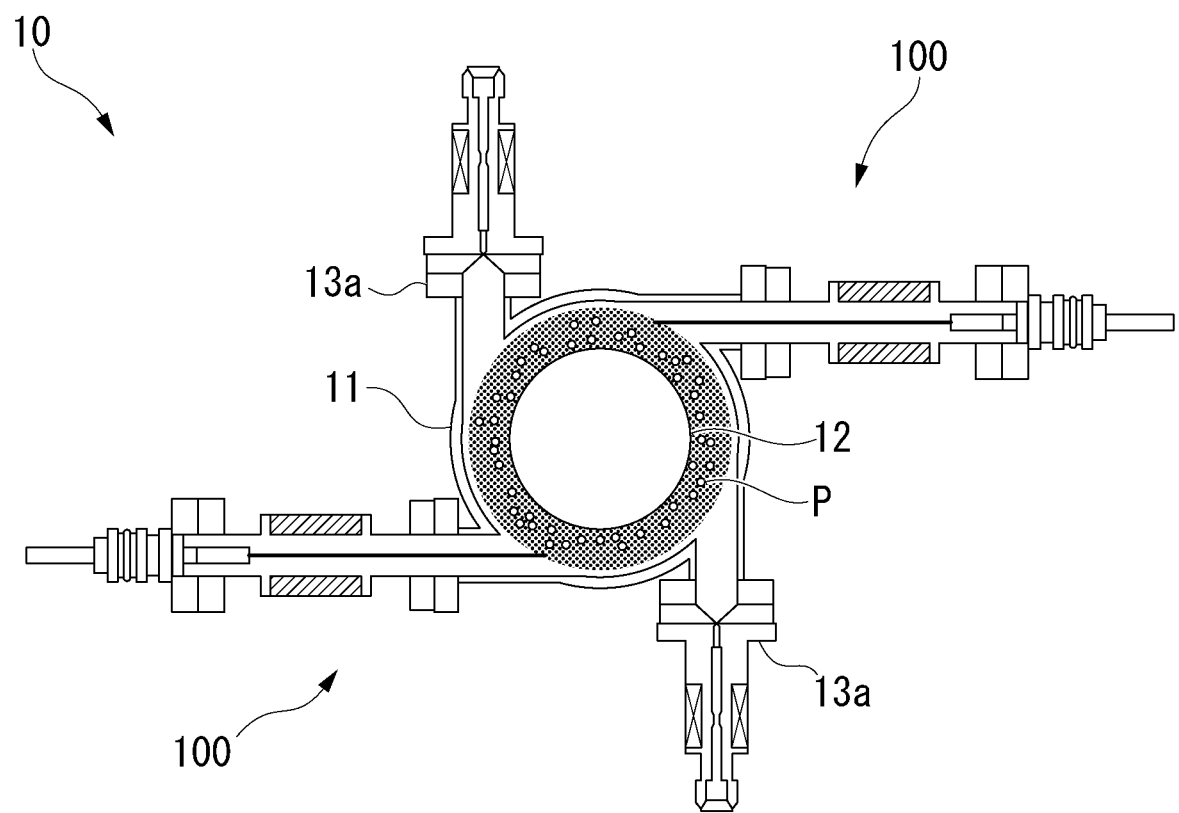
FIG. 7 is a transverse cross-sectional view of the magnetized plasmoid generation state in the first embodiment of the magnetized plasmoid injection device of the present invention.

FIG. 5 is a transverse cross-sectional view of an impurity diffusion state in the magnetized plasmoid injection device of the present embodiment. FIG. 6 is a longitudinal cross-sectional view of a plasma generation state in the magnetized plasmoid injection device of the present embodiment. FIG. 7 is a transverse cross-sectional view of the plasma generation state in the magnetized plasmoid injection device of the present embodiment. In the magnetized plasmoid injection device 10 of the present embodiment, first, the plasma generating gas is supplied from the plasma generating gas supply unit 13.

The plasma generating gas is ejected from the nozzle 13a in the tangential direction of the magnetized plasmoid generation space between the external electrode 11 and the internal electrode 12 which form the annular shape. Accordingly, the plasma generating gas flows stably in the magnetized plasmoid generation space and the introduced gas density is spatially uniform.

Next, the control unit in the power supply control unit 14 controls the impurity generation power supply to apply the voltage to the thin-rod electrode 101 of the impurity generation unit 100 for diffusing the impurity into the magnetized plasmoid generation space as shown in FIG. 5.

In this case, a range in which the impurity is diffused in the magnetized plasmoid generation space is preferably set to be, for example, equal to or smaller than a range in which the plasma is generated in a region centered on the nozzle 13a in the axial direction of the external electrode 11 and the internal electrode 12. The diffusion range of impurity can be controlled, for example, by setting a gas introduction time, a discharge timing in the impurity generation unit 100, a discharge timing of a magnetized plasmoid generation unit, and the like. The discharge timing of the magnetized plasmoid generation unit is set by the pulse power supply for the bias coil and the plasma power supply (power supply circuit).

Next, as shown in FIG. 6, the control unit in the power supply control unit 14 controls the plasma power supply (power supply circuit) to apply the discharge voltage between the external electrode 11 and the internal electrode 12 in the state where the bias magnetic field required for generating the spheromak plasma is applied between the external electrode 11 and the internal electrode 12 under the control of the pulse power supply for the bias coil.

Specifically, when the load signal is applied from the plasma power supply (power supply circuit) in the power supply control unit 14 to the space between the external electrode 11 and the internal electrode 12, the discharge is generated between the external electrode 11 and the internal electrode 12. Therefore, the discharge current flows and plasma P is generated, as shown in FIG. 7. The bias magnetic field generated by the bias coil 15 is spatially distributed controlled by the pulse power supply for the bias coil, the magnetic flux holding portion, and the control unit, and the magnetic flux is dispersed in a plasma generation region.

In the generated plasma P, magnetic fields in a poloidal direction and a toroidal direction are generated by the bias magnetic field due to the bias coil 15 together with the magnetic field due to the discharge current. The plasma P is emitted as the spheromak plasma from open ends of the external electrode 11 and the internal electrode 12. The emitted spheromak plasma is emitted at high speed in a state of the plasmoid without being immediately diffused.

At this time, the impurity is diffused in the magnetized plasmoid generation space before the plasma is generated. Therefore, the diffused impurity may be contained in the generated plasma P at a predetermined concentration and concentration distribution. In order to cause the diffused impurity to be contained in the generated plasma P as described above, for example, it is preferable that the thin-rod electrode 101 is installed near the nozzle 13a, which is a gas introduction place, and the impurity is diffused at the same time as the bias magnetic field is formed such that the ionized impurity element is captured in the plasma P.

In the magnetized plasmoid injection device 10 of the present embodiment, the plasma generating gas is supplied from the nozzle 13a in the tangential direction of the magnetized plasmoid generation space. Accordingly, in the magnetized plasmoid injection device 10, it is possible to generate stable plasma in a neutral state.

In the magnetized plasmoid injection device 10 of the present embodiment, the impurity generation unit 100 is provided in the tangential direction of the magnetized plasmoid generation space on the same plane as the nozzle 13a. Accordingly, it is possible to easily cause the ionized impurity to be contained in the plasma in the magnetized plasmoid injection device 10 of the present embodiment, whereas the ionized impurity has been difficult to be contained in the plasma since the impurity is repelled by the bias magnetic field in the device in the related art. At the same time, in the magnetized plasmoid injection device 10 of the present embodiment, it is possible to improve the stability of the generated plasma.

Further, the magnetized plasmoid injection device 10 of the present embodiment sputters the thin-rod electrode 101 to supply the impurity to the magnetized plasmoid generation space. Thus, in the magnetized plasmoid injection device 10 of the present embodiment, it is easy to precisely control an amount of the impurity generated by the sputtering. Therefore, in the magnetized plasmoid injection device 10 of the present embodiment, it is possible to extremely accurately set the impurity concentration contained in the magnetized plasmoid.

At the same time, in the magnetized plasmoid injection device 10 of the present embodiment, it is possible to obtain a desired type of impurity by replacing the thin-rod electrode 101 or by attaching a predetermined thin-rod electrode 101 in advance. Accordingly, in the magnetized plasmoid injection device 10 of the present embodiment, it is possible to control an amount and a composition ratio of the impurity contained in the plasma for an extremely short time, that is, for each magnetized plasmoid unit generated in a pulse shape. As a result, it is possible to easily set temporal changes of the amount and the composition ratio of the impurity contained in the emitted plasma, in the magnetized plasmoid generator 10 of the present embodiment.

Further, the magnetized plasmoid injection device 10 of the present embodiment supplies the impurity from the impurity generation unit 100 to cause the impurity to be uniformly contained in the magnetized plasmoid while the generated magnetized plasmoid advances in the magnetized plasmoid generation space formed by the external electrode 11 and the internal electrode 12 and is emitted. Accordingly, in the magnetized plasmoid injection device 10 of the present embodiment, it is possible to generate and inject the magnetized plasmoid having a uniform impurity concentration according to an axial length of the magnetized plasmoid generation space.

In the magnetized plasmoid injection device 10 of the present embodiment, it is possible to switch between a state in which the thin-rod electrode 101 is not sputtered and a state in which the thin-rod electrode 101 is sputtered. Accordingly, in the magnetized plasmoid injection device 10 of the present embodiment, it is possible to switch between the plasma containing no impurity and the plasma containing the impurity and to generate each of the plasma for a predetermined time.

In the magnetized plasmoid injection device 10 of the present embodiment, it is possible to extremely reduce adhesion of the impurity generated from the thin-rod electrode 101 to the surface of the internal electrode 12 by providing the impurity generation unit 100 in the tangential direction of the magnetized plasmoid generation space. At the same time, in the magnetized plasmoid injection device 10 of the present embodiment, it is possible to reduce the occurrence of a defect such as a substance adhering to the surface of the internal electrode 12 due to the plasma generating gas supplied from the nozzle 13a.

In the magnetized plasmoid injection device 10 of the present embodiment, it is not necessary to open, for the replacement, the entire area of the magnetized plasmoid generation space since the impurity type can be changed only by replacing the thin-rod electrode 101 in the impurity generation unit 100. Therefore, it is possible to reduce an adverse effect such as contamination of the inside of the device from the outside. As a result, in the magnetized plasmoid injection device 10 of the present embodiment, it is possible to reduce a work step in the maintenance of the device and to reduce a maintenance time.

In the magnetized plasmoid injection device 10 of the present embodiment, the bias magnetic field is formed and the plasma discharge is performed between the external electrode 11 and the internal electrode 12, immediately after the impurity is generated in the magnetized plasmoid generation space from the impurity generation unit 100. Therefore, it is possible to cause the ionized impurity, which is repelled by the bias magnetic field in the related art, to be contained in the plasma.

In the present embodiment, an example is shown in which the nozzle 13a of the plasma generating gas supply unit 13 is provided on the radially outside of the external electrode 11, but the present invention is not limited thereto. For example, a plasma generating gas supply unit may be provided radially inside of the internal electrode 12 as long as the plasma generating gas can be supplied between the external electrode 11 and the internal electrode 12.

In the magnetized plasmoid injection device 10 of the present embodiment, the nozzle 13a of the plasma generating gas supply unit 13 and the impurity generation unit 100 are opened to the external electrode 11 at different positions. On the contrary, the impurity generation unit 100 can be used as the nozzle by supplying the plasma generating gas from a base portion side of the impurity generation unit 100. In this case, it is possible to increase the amount of impurity supplied to the magnetized plasmoid generation space to generate the magnetized plasmoid having an increased impurity concentration.

In the magnetized plasmoid injection device 10 of the present embodiment, the plasma generating gas is supplied near the center of the bias coil 15. In this case, the efficiency for increasing the magnetic flux contained in the magnetized plasmoid is the highest. This is possible by providing the nozzle 13a of the plasma generating gas supply unit 13 so as to penetrate a part of the magnetic flux holding portion that covers the outside of the external electrode 11 as in the present embodiment.

Further, in the magnetized plasmoid injection device 10 of the present embodiment, two nozzles 13a of the plasma generating gas supply unit 13 and two impurity generation units 100 are opened to the external electrode 11. However, the present invention is not limited thereto. It is also possible to provide a plurality of three or more. In this case, the nozzle 13a and the impurity generation unit 100 may be provided in the tangential direction of the cylindrical magnetized plasmoid generation space.

In the magnetized plasmoid injection device 10 of the present embodiment, the plurality of the nozzles 13a of the plasma generating gas supply unit 13 and the plurality of the impurity generation units 100 are disposed on the same plane intersecting the axis of the magnetized plasmoid generation space, but may be disposed so as to be located in parallel planes having different axial positions of the magnetized plasmoid generation space. Alternatively, the plurality of the nozzles 13a of the plasma generating gas supply unit 13 and the plurality of the impurity generation units 100 may be disposed in a direction different from the direction along the axis orthogonal plane. Also in this case, the impurity generation unit 100 and the nozzle 13a may be provided in the tangential direction of the cylindrical magnetized plasmoid generation space.

Further, any one or a plurality of appropriately selected ones of the plurality of impurity generation units 100 and the plurality of nozzles 13a provided may be disposed in an inclined and intersecting plane as a state of being along a direction other than the plane orthogonal to the axes of the external electrode 11 and the internal electrode 12. Also in this case, the impurity generation unit 100 and the nozzle 13a may be provided in the tangential direction of the cylindrical magnetized plasmoid generation space. It is also possible not to provide the impurity generation unit 100.

Figure 8:
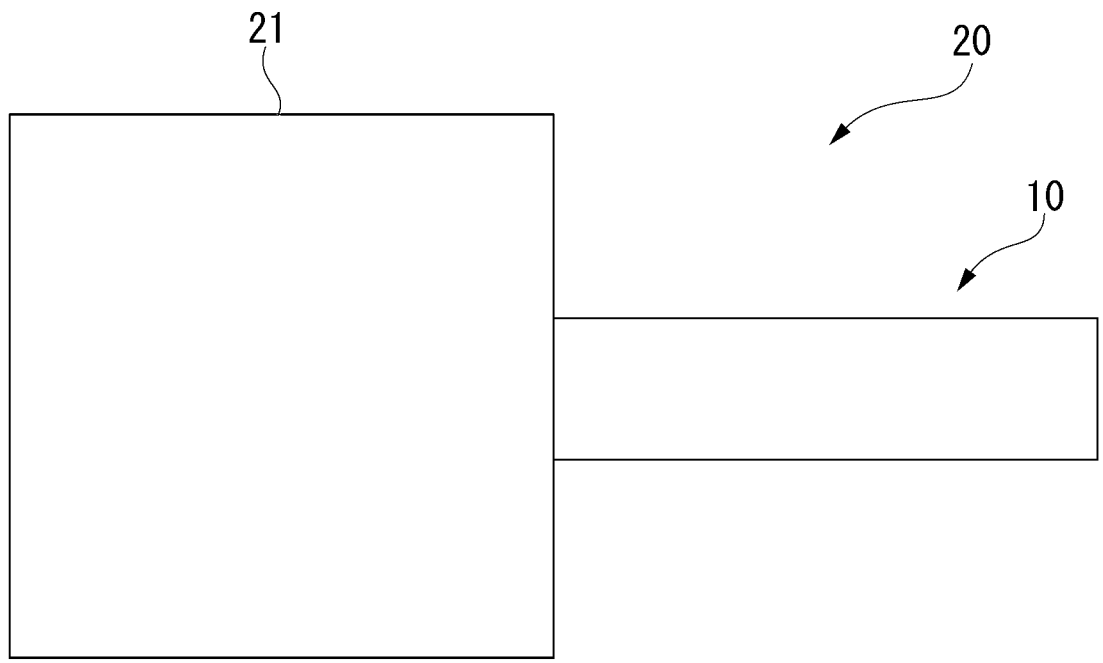
FIG. 8 is a schematic view of a second embodiment of a magnetic confinement plasma device of the present invention.

Hereinafter, a second embodiment of a magnetic confinement plasma device of the present invention will be described with reference to a drawing. FIG. 8 is a schematic view of the magnetic confinement plasma device of the present embodiment. In the present embodiment, a difference from the above-described first embodiment is a part for injecting the magnetized plasmoid. Other configurations corresponding to the above-described first embodiment are designated by the same reference numerals, and description thereof is omitted.

As shown in FIG. 8, a magnetic confinement plasma device 20 of the present embodiment has the magnetized plasmoid injection device 10 and a magnetic confinement plasma unit 21 as the part where the magnetized plasmoid injection device 10 injects the plasma.

The magnetic confinement plasma unit 21 is, for example, a core of a fusion reactor and receives the magnetized plasmoid containing an element serving as a tracer from the magnetized plasmoid injection device 10. For example, the magnetic confinement plasma unit 21 can analyze the behavior of plasma in the reactor with a spectroscope or the like using the injected magnetized plasmoid containing the element. The magnetic confinement plasma unit 21 is configured of a port required for receiving the plasmoid, a coil forming a confined magnetic field, a power supply required for generating target plasma, a vacuum pump, and the like. In the magnetized plasmoid injection device 10 of the present embodiment, the thin-rod electrode 101 at one place may be made of a conductive material, and a compound or alloy may be used. For example, the thin-rod electrode 101 is made of one or more elements selected from W, Sn, Nd, Sm, Gd, Tb, Dy, Er, Yb, Au, Pb, Bi, Ti, Cu, C, Al, and Mo.

It is possible to provide a plurality of impurity generation units 100 having these thin-rod electrodes 101.

With the magnetic confinement plasma device 20 of the present embodiment, it is possible to supply the impurity, which has been difficult to be contained in the related art, to the magnetic confinement plasma unit 21, which is the inside of the reactor, and to observe and measure the behavior thereof by a spectroscope or the like.

In a magnetic confinement plasma device in the related art, a pellet containing a minute solid tracer element called puff or an impurity is ionized or evaporated to supply to the magnetic confinement plasma unit 21. On the contrary, the magnetized plasmoid containing the element serving as the tracer can be supplied in the magnetic confinement plasma device 20 of the present embodiment. Therefore, it is possible to supply the tracer element while preventing decrease of plasma energy (local cooling of plasma) in the magnetic confinement plasma unit 21 generated by supplying a solid. Accordingly, it is possible to minimize the change given to the behavior of the plasma in the magnetic confinement plasma unit 21 and to supply the tracer element.

According to the present embodiment, the magnetized plasmoid containing the element serving as the tracer, which has been difficult in the related art, can be supplied. Therefore, it is possible to easily supply the impurity ionized in advance to the plasma of the magnetic confinement plasma unit 21. At the same time, it is possible to improve the stability of the generated plasma. In the method using the solid pellet in the related art, there is a problem that the tracer cannot be transported to the central part due to being blocked by the confined magnetic field since the pallet is ionized before reaching core plasma due to a slow injected speed. However, it is possible to supply the magnetized plasmoid containing the element serving as the tracer without causing this problem in the magnetic confinement plasma device 20 of the present embodiment.

Further, since the magnetic confinement plasma device 20 of the present embodiment includes the impurity generation unit 100, it becomes easy to precisely control an amount of the element serving as the tracer contained in the magnetized plasmoid to be injected. Accordingly, in the magnetic confinement plasma device 20 of the present embodiment, it is possible to extremely accurately set the amount of the element serving as the tracer and to be supplied to the plasma of the magnetic confinement plasma unit 21.

At the same time, in the magnetic confinement plasma device 20 of the present embodiment, it is possible to obtain a desired type of element serving as the tracer and to be supplied to the plasma of the magnetic confinement plasma unit 21 by replacing the thin-rod electrode 101 of the impurity generation unit 100 or by attaching a predetermined thin-rod electrode 101 in advance. Accordingly, in the magnetic confinement plasma device 20 of the present embodiment, it is possible to control the amount and the composition ratio of the element serving as the tracer and to be supplied to the plasma of the magnetic confinement plasma unit 21 for an extremely short time, that is, for each magnetized plasmoid unit generated in a pulse shape. As a result, in the magnetic confinement plasma device 20 of the present embodiment, it is possible to set temporal changes of the amount and the composition ratio of the element serving as the tracer and to be supplied to the plasma of the magnetic confinement plasma unit 21.

Further, in the magnetic confinement plasma device 20 of the present embodiment, it is possible to supply the magnetized plasmoid containing the element serving as the tracer and uniformized in advance to the plasma of the magnetic confinement plasma unit 21 by the magnetized plasmoid injection device 10. Accordingly, in the magnetic confinement plasma device 20 of the present embodiment, it is possible to improve the uniformization of the tracer element in the magnetic confinement plasma unit 21.

In the magnetic confinement plasma device 20 of the present embodiment, it is possible to switch between a state in which the thin-rod electrode 101 of the impurity generation unit 100 is not sputtered and a state in which the thin-rod electrode 101 thereof is sputtered and select the presence or absence of the tracer element to supply the magnetized plasmoid to the plasma of the magnetic confinement plasma unit 21.

In the magnetic confinement plasma device 20 of the present embodiment, it is possible to extremely reduce the adhesion of the impurity generated from the thin-rod electrode 101 to the surface of the internal electrode 12 by providing the impurity generation unit 100 in the tangential direction of the magnetized plasmoid generation space. At the same time, in the magnetic confinement plasma device 20 of the present embodiment, it is possible to reduce the occurrence of a defect such as a substance adhering to the surface of the internal electrode 12 due to the plasma generating gas supplied from the nozzle 13a. In the magnetic confinement plasma device 20 of the present embodiment, it is possible to change the type of the tracer element only by replacing the thin-rod electrode 101 in the impurity generation unit 100. Thus, in the magnetic confinement plasma device 20 of the present embodiment, it is not necessary to open, for the replacement, the entire area of the magnetized plasmoid generation space of the magnetized plasmoid injection device 10 and the magnetic confinement plasma unit 21 communicating with the magnetized plasmoid generation space of the magnetized plasmoid injection device 10. Therefore, it is possible to reduce an adverse effect such as contamination of the inside of the device from the outside. As a result, in the magnetic confinement plasma device 20 of the present embodiment, it is possible to reduce a work step in the maintenance of the device and to reduce a maintenance time.

In the magnetic confinement plasma device 20 of the present embodiment, both the nozzle 13a of the plasma generating gas supply unit 13 and the impurity generation unit 100 in the magnetized plasmoid injection device 10 are opened to the external electrodes 11. However, the impurity generation unit 100 can be used as the nozzle by supplying the plasma generating gas from the base portion side of the impurity generation unit 100. In this case, in the magnetic confinement plasma device 20 of the present embodiment, it is possible to increase the amount of the tracer element contained in the magnetized plasmoid supplied to the magnetic confinement plasma unit 21. Accordingly, in the magnetic confinement plasma device 20 of the present embodiment, in a case where the tracer element such as tungsten is mixed, the gas is also supplied from the impurity generation unit 100, which is a tracer introduction electrode portion, and the thin-rod electrode 101 is discharged at a negative high voltage to increase the sputtering efficiency by ion bombing. Therefore, it is possible to increase the amount of the tracer element.

Figure 9:
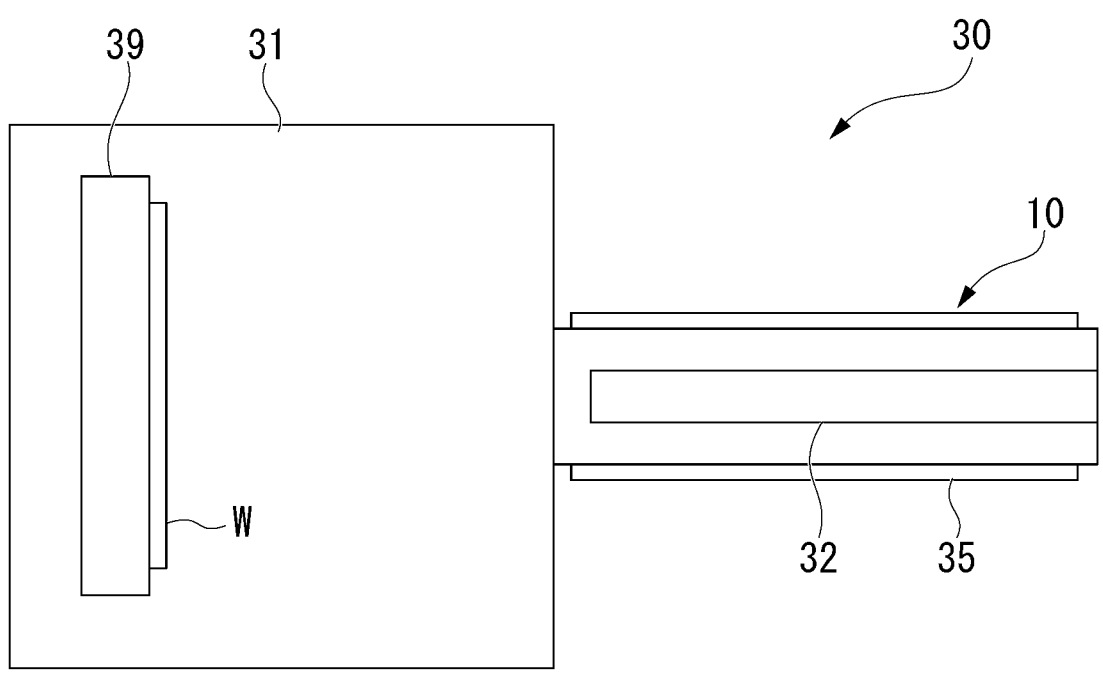
FIG. 9 is a schematic view of a third embodiment of a plasma treatment device of the present invention.

Hereinafter, a third embodiment of a plasma treatment device of the present invention will be described with reference to a drawing. FIG. 9 is a schematic view of the plasma treatment device of the present embodiment. A difference from the first and second embodiments described above in the present embodiment is a part where the film is formed by the injected magnetized plasmoid. Other corresponding components are designated by the same reference numerals, and description thereof is omitted.

A plasma treatment device 30 of the present embodiment uses the plasma injected from the magnetized plasmoid injection device 10 to perform plasma treatment, for example, film forming treatment on a substrate W to be treated. As shown in FIG. 9, the plasma treatment device 30 of the present embodiment has an internal electrode 32 made of a film forming material, a bias coil 35 located outside the external electrode 11, a treatment chamber 31 which is connected to the magnetized plasmoid injection device 10 and into which the magnetized plasmoid is injected, and a stage (substrate-to-be-treated holding portion) 39 disposed in the treatment chamber 31 to hold the substrate-to-be-treated.

The internal electrode 32 corresponds to the internal electrode 12 in the above-described embodiment and is formed in a columnar shape made of a film forming material. Examples of the film forming material used as the internal electrode 32 include metal, carbon, and a conductive compound or mixture containing metal and carbon.

The substrate W to be treated, which is a film forming target, includes various substrates such as a silicon substrate, an aluminum substrate, and polyethylene terephthalate (PET). In the plasma treatment device 30 of the present embodiment, since a carbon ion is accelerated by Lorentz force due to the discharge current and injected on the substrate W to be treated, it is not always necessary to control the potential of the substrate W to be treated. Therefore, it is possible to form a film on a dielectric material or the like whose potential control is difficult. In the plasma treatment device 30 of the present embodiment, there is no need to control the potential of the substrate W to be treated. Therefore, it is advantageous even in a case where it is difficult to individually apply the potential to the substrate W to be treated in line production. In the plasma treatment device 30 of the present embodiment, the emitted spheromak plasma is a low heat load. Therefore, it is possible to form a diamond-like carbon (DLC) thin film or the like even in a case where the substrate W to be treated is sensitive to heat. Further, hardness of the DLC thin film produced becomes high by increasing the collision energy. Thus, in the plasma treatment device 30 of the present embodiment, it is possible to increase the hardness by positively applying the potential to the substrate W to be treated in a case where the potential can be applied to increase the collision energy.

The treatment chamber 31 is sealed by satisfying a predetermined film forming condition. A structure of the treatment chamber 31 is not particularly limited as long as the plasma treatment can be performed internally. The treatment chamber 31 is a vacuum chamber. The treatment chamber 31 is connected to the magnetized plasmoid injection device 10. The treatment chamber 31 is configured to receive the plasma emitted from open ends of the external electrode 11 and the internal electrode 32. Specifically, the treatment chamber 31 is connected to the open end of the external electrode 11 through an insulator, and the emitted plasma is introduced into the inside of the treatment chamber 31.

The bias coil 35 may be wound so as to surround the outer circumference of the external electrode 11. The bias coil 35 provides a vertical magnetic field between the external electrode 11 and the internal electrode 32 to extend an effective inter-electrode distance in order to promote dielectric breakdown. At the same time, the bias coil 35 applies the bias magnetic field to the plasma generated between the external electrode 11 and the internal electrode 32. Due to these functions of the bias coil 35, the plasma is emitted in a state including the magnetic field due to the discharge current and the bias magnetic field. Therefore, an isolated magnetized plasmoid with a spheromak-like magnetic field structure is generated by the function of the bias coil 35 and is filtered by the magnetic field.

The stage 39 is fixed in the treatment chamber 31. The stage 39 is held such that a surface to be treated for film forming of the substrate W to be treated faces an axial direction of the internal electrode 32 perpendicularly. The stage 39 may be configured such that a distance between the magnetized plasmoid injection device 10 and the substrate W to be treated can be continuously changed. The stage 39 may be grounded or have a negative voltage so as to draw a plasma ion toward the stage 39 side. In this case, the treatment chamber 31 and the stage 39 may be insulated. The stage 39 may be disposed such that the center of the magnetized plasmoid injection device 10 matches the center of the substrate W to be treated.

At the time of film forming in the plasma treatment device 30 of the present embodiment, first, the plasma generating gas, for example, argon gas is supplied from the plasma generating gas supply unit 13 to the magnetized plasmoid generation space in the magnetized plasmoid injection device 10. At the time of film forming in the plasma treatment device 30, the impurity is also supplied to the magnetized plasmoid generation space by the impurity generation unit 100.

At the time of film forming in the plasma treatment device 30, the vertical magnetic field is applied between the external electrode 11 and the internal electrode 32 by the bias coil 35. Accordingly, an electron reaches the external electrode 11 while rotating around an outer circumference of the internal electrode 32 in the magnetized plasmoid generation space. Therefore, the elongation of effective inter-electrode distance promotes the dielectric breakdown, and the plasma is discharged. The discharge voltage is applied between the external electrode 11 and the internal electrode 32 to cause the discharge between the external electrode 11 and the internal electrode 32, and the plasma is generated. Along with this discharge, a radial current flows through the plasma. In the plasma, a toroidal magnetic field is generated by the current of the internal electrode 32. At the time of this discharge, a surface of the internal electrode 32 made of the film forming material is scraped off and mixed into the plasma.

At the time of film forming in the plasma treatment device 30, acceleration is made by the Lorentz force due to the radial current in the plasma and the magnetic field in the toroidal direction in the axial direction of the internal electrode 32 while dragging the bias magnetic field. Further, at the time of film forming in the plasma treatment device 30, the bias magnetic field on a tip end side of the magnetized plasmoid injection device 10 becomes the poloidal magnetic field due to magnetic recombination, and the spheromak plasma is emitted from the open ends of the external electrode 11 and the internal electrode 32.

The spheromak plasma is emitted at high speed in the state of the plasmoid without being immediately diffused. The spheromak plasma contains a particle (ion) of the film forming material from which the surface of the internal electrode 32 has been scraped off. Therefore, the spheromak plasma is made to collide with the substrate W to be treated to deposit the film forming material particle on the substrate W to be treated.

A macro particle melted from the internal electrode 32 does not have an electric charge. Therefore, the particle is not subjected to electromagnetic acceleration and does not contribute to film forming as it is. In the plasma treatment device 30, with repeating this plasma discharge a plurality of times, the film forming material particle containing the impurity is deposited on the substrate W to be treated until a desired film thickness is obtained, and thus it is possible to obtain a desired film to be treated.

In the plasma treatment device 30 of the present embodiment, it is possible to control the impurity concentration to a predetermined state in a film thickness direction of the film to be formed at the time of film forming on the substrate W to be treated. In particular, in the plasma treatment device 30, the concentration of the impurity contained in the generated magnetized plasmoid to the predetermined state is controlled by the impurity generation unit 100, and thus it is possible to change the impurity concentration in the film thickness direction in the film to be treated formed on the substrate W to be treated. Alternatively, in the plasma treatment device 30, the impurity amounts supplied from the impurity generation units 100 at two places are individually controlled assuming that the thin-rod electrodes 101 of the impurity generation unit 100 at two places are formed of different types, and thus it is possible to form the film to be treated having different concentration gradients in the film thickness direction.

Further, in the plasma treatment device 30, a state is made in which the impurities are not supplied from the impurity generation units 100 at two places during a film forming treatment time, and thus it is possible to form a region where the impurity is not contained at the treatment place in the film thickness direction. In the plasma treatment device 30, the impurity forming the thin-rod electrode 101 is appropriately selected, and thus it is possible to form a film containing an impurity type that cannot be performed in the related art.

In particular, even in a case where it is extremely difficult to produce a sputtering target with a predetermined composition ratio in plasma film forming using plasma by glow discharge, it is possible to form a film having the predetermined composition ratio regardless of the difficulty in producing the target, in the plasma treatment device 30. Further, even in a case where it is difficult to form a composition ratio inclined in the film thickness direction in the film forming using a target, it is possible to easily form the composition ratio in the plasma treatment device 30.

In the plasma treatment device 30, it is possible to form a film having the predetermined composition ratio without being affected by defects that occur in an erosion region of the target, particularly cracking in the target, non-uniformity of the composition ratio in a target alloy, non-uniformity of ionization or plasma formation, and the like.

In the plasma treatment device 30 of the present embodiment, the impurity generation unit 100 is included in addition to the internal electrode 32 made of the film forming material, and thus it is easy to precisely control the amount of impurity contained in the magnetized plasmoid to be injected. Accordingly, in the plasma treatment device 30, it is possible to extremely accurately set the amount of impurity contained in the film to be treated, which is formed on the substrate-to-be-treated in the treatment chamber 31.

At the same time, in the plasma treatment device 30, it is possible to obtain a desired type of impurity contained in the film to be treated, which is formed on the substrate-to-be-treated in the treatment chamber 31, by replacing the thin-rod electrode 101 of the impurity generation unit 100 or by attaching a predetermined thin-rod electrode 101 in advance. Alternatively, in the plasma treatment device 30, it is possible to supply a plurality of types of impurity at the same time by replacing the thin-rod electrode 101 of the impurity generation unit 100 or by attaching a predetermined thin-rod electrode 101 in advance. Accordingly, in the plasma treatment device 30, it is possible to control the amount and the composition ratio of the impurity contained in the film to be treated, which is formed on the substrate-to-be-treated in the treatment chamber 31, for an extremely short time, that is, for each magnetized plasmoid unit generated in a pulse shape. Therefore, in the plasma treatment device 30, it is possible to easily set changes of the amount and the composition ratio of the impurity contained in the film to be treated, which is formed on the substrate-to-be-treated in the treatment chamber 31, in the film thickness direction.

Further, in the plasma treatment device 30 of the present embodiment, it is possible to cause the magnetized plasmoid containing the impurity uniformized in advance to be contained in the film to be treated, which is formed on the substrate-to-be-treated in the treatment chamber 31, by the magnetized plasmoid injection device 10. Accordingly, in the plasma treatment device 30, it is possible to improve the uniformity of the impurity contained in the film to be treated, which is formed on the substrate-to-be-treated in the treatment chamber 31.

The plasma treatment device 30 switches between the state in which the thin-rod electrode 101 of the impurity generation unit 100 is not sputtered and the state in which the thin-rod electrode 101 thereof is sputtered. Accordingly, in the plasma treatment device 30, it is possible to select the presence or absence of the impurity in the film thickness direction to cause the impurity to be contained in the film to be treated, which is formed on the substrate-to-be-treated in the treatment chamber 31.

In the plasma treatment device 30, the impurity generation unit 100 is provided in the tangential direction of the magnetized plasmoid generation space, and thus it is possible to extremely reduce the adhesion of the impurity generated from the thin-rod electrode 101 to the surface of the internal electrode 12. At the same time, in the plasma treatment device 30, it is possible to reduce the occurrence of a defect such as a substance adhering to the surface of the internal electrode 12 due to the plasma generating gas supplied from the nozzle 13a.

In the plasma treatment device 30, it is possible to change the type of the tracer element only by replacing the thin-rod electrode 101 in the impurity generation unit 100. Thus, in the plasma treatment device 30, it is not necessary to open, for the replacement, the entire area of the magnetized plasmoid generation space of the magnetized plasmoid injection device 10 and the treatment chamber 31 communicating with the magnetized plasmoid generation space. Therefore, in the plasma treatment device 30, it is possible to reduce an adverse effect such as contamination of the inside of the device from the outside. As a result, in the plasma treatment device 30, it is possible to reduce a work step in the maintenance of the device and to reduce a maintenance time.

In the plasma treatment device 30 of the present embodiment, both the nozzle 13a of the plasma generating gas supply unit 13 and the impurity generation unit 100 in the magnetized plasmoid injection device 10 are opened to the external electrodes 11. However, the impurity generation unit 100 can be used as the nozzle by supplying the plasma generating gas from the base portion side of the impurity generation unit 100. In this case, in the plasma treatment device 30, it is possible to increase the amount of the impurity contained in the film to be treated, which is formed on the substrate-to-be-treated in the treatment chamber 31.

Further, in the plasma treatment device 30 of the present embodiment, the substrate W to be treated is disposed so as to face the magnetized plasmoid injection device 10. However, the substrate W to be treated may be disposed so as to be inclined with respect to the axial direction of the magnetized plasmoid injection device 10. In the plasma treatment device 30 of the present embodiment, the center of the magnetized plasmoid injection device 10 and the center of the substrate W to be treated are matched, but may not be matched.

In the plasma treatment device 30 of the present embodiment, the film forming treatment is performed as the plasma treatment in the plasma treatment device 30. However, another piece of treatment using the plasma may be performed in the plasma treatment device 30. For example, the plasma treatment device 30 may be a device capable of performing plasma etching, plasma cleaning, surface modification, or ion implantation, or performing these by switching.

The device of the present invention is not limited to each of the above-described embodiments, and it goes without saying that various modifications can be made without departing from the gist of the present invention. In particular, the configurations of each embodiment may be partially or may be combined in combination.

In each of the above-described embodiments, there is a possibility that control can be made from an operation region in which sputtering (sputtering by ions) is dominant to a region in which evaporation (evaporation by heat) works significantly with a pulse length of the applied current and the voltage, and it is expected that the film forming efficiency is improved by emphasizing the evaporation particularly for carbon or the like having poor sputtering efficiency.

INDUSTRIAL APPLICABILITY

Examples of utilization of the present invention include functional diamond-like carbon formation, alloy thin film formation, functionally graded thin film formation, and tracer element injection into a fusion device.

LIST OF REFERENCE NUMBERS

10: magnetized plasmoid injection device
11: external electrode
11a: flange
12: internal electrode
12a: flange
13: plasma generating gas supply unit
13a: nozzle
14: power supply control unit
15: bias coil (magnetic field generation unit)
17: cylindrical member
18: insulation member
20: magnetic confinement plasma device
21: plasma unit
30: plasma treatment device
31: treatment chamber
32: internal electrode
35: bias coil (magnetic field generation unit)
39: stage (substrate-to-be-treated holding portion)
100: impurity generation unit
101: thin-rod electrode
102: cover electrode
103: insulation member
104: cover electrode base portion
105: separation portion
P: plasma
W: substrate-to-be-treated

What is claimed is:

1. A magnetized plasmoid injection device comprising:
a cylindrical external electrode;
a cylindrical internal electrode coaxially disposed inside the external electrode;
a plasma generating gas supply unit configured to supply plasma generating gas in a pulse shape between the external electrode and the internal electrode;
a magnetic field generation unit configured to apply a magnetic field that generates magnetized plasmoid between the external electrode and the internal electrode;
a plasma power supply configured to apply a discharge voltage between the external electrode and the internal electrode; and
an impurity generation unit configured to cause the magnetized plasmoid to contain an impurity, the impurity generation unit including a cover electrode that opens to the external electrode, a thin-rod electrode that is located inside the cover electrode and is formed of an impurity, an impurity generation power supply that applies a voltage to the cover electrode and the thin-rod electrode, and a power supply control unit,
wherein the impurity constituting the thin-rod electrode is ionized or particle-like, and the power supply control unit is configured to control the voltage applied by the impurity generation power supply to the cover electrode and the thin-rod electrode to scatter the impurity from the thin-rod electrode and to diffuse the impurity into a magnetized plasmoid generation space formed between the external electrode and the internal electrode.

2. The magnetized plasmoid injection device according to claim 1, wherein a plurality of the impurity generation units are provided.

3. The magnetized plasmoid injection device according to claim 1, wherein the thin-rod electrode of the impurity generation unit is disposed outside an annular shape formed by the external electrode and the internal electrode in a tangential direction thereof.

4. The magnetized plasmoid injection device according to claim 1, wherein a voltage is applied between the external electrode and the internal electrode at the same time as or after the voltage is applied to the impurity generation unit.

5. The magnetized plasmoid injection device according to claim 1, wherein the cover electrode of the impurity generation unit has a cylindrical shape having an inner diameter dimension smaller than a radial distance of an annular shape formed by the external electrode and the internal electrode.

6. The magnetized plasmoid injection device according to claim 1,
wherein the plasma generating gas supply unit has a nozzle that opens to the external electrode, and
the nozzle is disposed along a tangential direction of an annular shape formed by the external electrode and the internal electrode.

7. The magnetized plasmoid injection device according to claim 6, wherein the nozzle of the plasma generating gas supply unit and the thin-rod electrode of the impurity generation unit are disposed along the same plane intersecting axes of the external electrode and the internal electrode.

8. The magnetized plasmoid injection device according to claim 1, wherein the impurity that is not contained in the internal electrode.

9. A magnetic confinement plasma device comprising:
the magnetized plasmoid injection device according to claim 1,
wherein the magnetized plasmoid is injected from the magnetized plasmoid injection device.

10. A plasma treatment device comprising:
the magnetized plasmoid injection device according to claim 1; and
a substrate-to-be-treated holding portion,
wherein the magnetized plasmoid is injected from the magnetized plasmoid injection device onto a substrate-to-be-treated held by the substrate-to-be-treated holding portion.

11. The plasma treatment device according to claim 10, wherein the plasma treatment device performs plasma film forming and plasma etching.

12. A magnetized plasmoid injection device comprising:
a cylindrical external electrode;
a cylindrical internal electrode coaxially disposed inside the external electrode;
a plasma generating gas supply unit configured to supply plasma generating gas in a pulse shape between the external electrode and the internal electrode;
a magnetic field generation unit configured to apply a magnetic field that generates magnetized plasmoid between the external electrode and the internal electrode;
a plasma power supply configured to apply a discharge voltage between the external electrode and the internal electrode; and
an impurity generation unit configured to cause the magnetized plasmoid to contain an impurity, the impurity generation unit including a cover electrode that opens to the external electrode, a thin-rod electrode that is located inside the cover electrode and is formed of an impurity, an impurity generation power supply that applies a voltage to the cover electrode and the thin-rod electrode, and a power supply control unit,
wherein the plasma generating gas supply unit has a nozzle that opens to the external electrode, and the nozzle is disposed along a tangential direction of an annular shape formed by the external electrode and the internal electrode, such that a gas ejection direction from the nozzle is the tangential direction of the annular shape, and
wherein the impurity constituting the thin-rod electrode is ionized or particle-like, and the power supply control unit is configured to control the voltage applied by the impurity generation power supply to the cover electrode and the thin-rod electrode to scatter the impurity from the thin-rod electrode and to diffuse the impurity into a magnetized plasmoid generation space formed between the external electrode and the internal electrode.

13. The magnetized plasmoid injection device according to claim 12, wherein the impurity that is not contained in the internal electrode.

14. A magnetic confinement plasma device comprising:
the magnetized plasmoid injection device according to claim 12,
wherein the magnetized plasmoid is injected from the magnetized plasmoid injection device.

15. A plasma treatment device comprising:
the magnetized plasmoid injection device according to claim 12; and
a substrate-to-be-treated holding portion,
wherein the magnetized plasmoid is injected from the magnetized plasmoid injection device onto a substrate-to-be-treated held by the substrate-to-be-treated holding portion.

16. The plasma treatment device according to claim 15, wherein the plasma treatment device performs plasma film forming and plasma etching.

\* \* \* \* \*